United States Patent
Gioulekas et al.

(10) Patent No.: US 8,898,538 B2
(45) Date of Patent: Nov. 25, 2014

(54) CONSTRUCTION OF MULTI RATE LOW DENSITY PARITY CHECK CONVOLUTIONAL CODES

(75) Inventors: Fotios Gioulekas, Palamas (GR); Constantinos Petrou, Athens (GR); Michael Birbas, Patras (GR)

(73) Assignee: Analogies SA, Patras (GR)

( * ) Notice: Subject to any disclaimer, the term of this patent is extended or adjusted under 35 U.S.C. 154(b) by 78 days.

(21) Appl. No.: 13/594,344

(22) Filed: Aug. 24, 2012

(65) Prior Publication Data

US 2013/0139025 A1    May 30, 2013

Related U.S. Application Data

(60) Provisional application No. 61/526,697, filed on Aug. 24, 2011.

(51) Int. Cl.
| | |
|---|---|
| *H03M 13/00* | (2006.01) |
| *H03M 13/13* | (2006.01) |
| *H03M 13/11* | (2006.01) |

(52) U.S. Cl.
CPC ............ *H03M 13/13* (2013.01); *H03M 13/611* (2013.01); *H03M 13/6516* (2013.01); *H03M 13/6362* (2013.01); *H03M 13/112* (2013.01); *H03M 13/658* (2013.01); *H03M 13/6561* (2013.01); *H03M 13/1154* (2013.01); *H03M 13/1117* (2013.01); *H03M 13/618* (2013.01); *H03M 13/635* (2013.01); *H03M 13/6583* (2013.01)
USPC .......................................................... 714/758

(58) Field of Classification Search
CPC ............ H03M 13/13; H03M 13/1117; H03M 13/112; H03M 13/1154; H03M 13/611; H03M 13/618; H03M 13/635; H03M 13/6362; H03M 13/6516; H03M 13/6561; H03M 13/658; H03M 13/6583
See application file for complete search history.

(56) References Cited

U.S. PATENT DOCUMENTS

| | | | | |
|---|---|---|---|---|
| 7,673,213 | B2 * | 3/2010 | Chugg et al. ................... | 714/755 |
| 7,783,952 | B2 * | 8/2010 | Nimbalker et al. ............. | 714/755 |
| 7,882,418 | B2 * | 2/2011 | Lee et al. ....................... | 714/758 |
| 8,359,515 | B2 * | 1/2013 | Gunnam ........................ | 714/752 |
| 2006/0031737 | A1 * | 2/2006 | Chugg et al. ................... | 714/755 |

(Continued)

OTHER PUBLICATIONS

Serial and Parallel Concatenated Differential Space-Time Coding—Yi Yao, Mostofa Howlader, 2002.*

(Continued)

*Primary Examiner* — Guerrier Merant
(74) *Attorney, Agent, or Firm* — DP IP Group; Franco S. De Liguori

(57) ABSTRACT

A device for encoding a sequence of information bits includes an LDPC-CC encoder to generate a first part of a codeword from a sequence of information bits and a set of programmable accumulators coupled to the LDPC-CC encoder to generate a second part of the codeword. The second part of the codeword is combined with the first part of the codeword to generate the codeword. The code rate of the codeword is varied by the number of accumulators being enabled to connect to the encoder. A puncturing unit is coupled to the output of the encoder for shortening the length of the first part of the codeword. A rate matching unit is coupled to the output of the encoder, to the output of the puncturing unit and to the output of the set of programmable accumulator to further adjust the code rate of the codeword.

3 Claims, 21 Drawing Sheets

(56) References Cited

U.S. PATENT DOCUMENTS

| | | | |
|---|---|---|---|
| 2007/0011566 A1* | 1/2007 | Gray et al. | 714/758 |
| 2008/0028274 A1* | 1/2008 | Lin | 714/752 |
| 2008/0072122 A1* | 3/2008 | Nimbalker et al. | 714/774 |
| 2008/0282127 A1* | 11/2008 | Mantha et al. | 714/751 |
| 2010/0205511 A1* | 8/2010 | Murakami et al. | 714/781 |
| 2010/0269009 A1* | 10/2010 | Okamura et al. | 714/752 |
| 2013/0254638 A1* | 9/2013 | Okamura et al. | 714/786 |

OTHER PUBLICATIONS

A Low Complexity and Programmable Encoder Architecture of the LDPC Codes for DVB-S2 Takashi Yokokawa, Misa Nakane, Makiko Kan, 2006.*

* cited by examiner $$p(t) = u(t) \otimes p(t-1)$$

Sum-Product update rule (Example 1)

$$C_{ij}(t) = \text{sgn}[V_{ji}(t)]\text{sgn}[V_{qi}(t-1)]\min(|V_{ji}(t)|,|V_{qi}(t-1)|), \forall t$$

$$C_{ij}(t) = \text{sgn}[V_{ji}(t)]\text{sgn}[V_{qi}(t-1)]\min(|V_{ji}(t)|,|V_{qi}(t-1)|)\cdot\log(1+\exp(-|V_{ji}(t)|+|V_{qi}(t-1)|))-\log(1+\exp(-|V_{ji}(t)|-|V_{qi}(t-1)|)), \forall t$$

Min-Sum update rule (Example 2)

$$C_{ij}(t) = \text{sgn}[V_{ji}(t)]\text{sgn}[V_{qi}(t-1)]\min(|V_{ji}(t)|,|V_{qi}(t-1)|), \forall t$$
$$C_{ij}(t) = \text{sgn}[V_{ji}(t)]\text{sgn}[V_{qi}(t-1)]\min(|V_{ji}(t)|,|V_{qi}(t-1)|), \forall t$$

Normalized Min-Sum update rule (Example 3)

$$C_{ij}(t) = (1/\alpha)\cdot \text{sgn}[V_{ji}(t)]\text{sgn}[V_{qi}(t-1)]\min(|V_{ji}(t)|,|V_{qi}(t-1)|), \alpha\geq 1, \forall t$$
$$C_{ij}(t) = (1/\alpha)\cdot \text{sgn}[V_{ji}(t)]\text{sgn}[V_{qi}(t-1)]\min(|V_{ji}(t)|,|V_{qi}(t-1)|), \alpha\geq 1, \forall t$$

Offset Min-Sum update rule (Example 4)

$$C_{ij}(t) = \text{sgn}[V_{ji}(t)]\text{sgn}[V_{qi}(t-1)]\max(0,\min(|V_{ji}(t)|,|V_{qi}(t-1)|)-\beta), \beta\geq 0, \forall t$$
$$C_{ij}(t) = \text{sgn}[V_{ji}(t)]\text{sgn}[V_{qi}(t-1)]\max(0,\min(|V_{ji}(t)|,|V_{qi}(t-1)|)-\beta), \beta\geq 0, \forall t$$

FIG. 12A

MacLaurin update rule (Example 5)

$Cc_2(t) = \alpha \cdot \{sgn[Vq_2(t)]sgn[Vq_2(t-1)]\min[|Vq_2(t)|,|Vq_2(t-1)|] + \max(0, \log 2 - 0.3 \cdot |Vq_2(t) + Vq_2(t-1)|) - \max(0, \log 2 - 0.3 \cdot |Vq_2(t) - Vq_2(t-1)|)\}$, $0 < \alpha < 1, \forall t$ $Cc_3(t) = \alpha \cdot \{sgn[Vq_3(t)]sgn[Vq_3(t-1)]\min[|Vq_3(t)|,|Vq_3(t-1)|] + \max(0, \log 2 - 0.3 \cdot |Vq_3(t) + Vq_3(t-1)|) - \max(0, \log 2 - 0.3 \cdot |Vq_3(t) - Vq_3(t-1)|)\}$, $0 < \alpha < 1, \forall t$

Piece-Wise-Linear update rule (Example 6)

$Cc_2(t) = \alpha \cdot \{\max\{0, 0.75 \cdot [Vq_2(t) + Vq_2(t-1)] + 0.5, 0.25 \cdot [Vq_2(t) + Vq_2(t-1)] + 0.5\}[Vq_2(t) + Vq_2(t-1)]$
$- \max\{Vq_2(t), 0.25 \cdot Vq_2(t) + 0.75 \cdot Vq_2(t-1), 0.75 \cdot Vq_2(t) + 0.25 \cdot Vq_2(t-1), Vq_2(t-1)\}\}, 0 < \alpha < 1, \forall t$ $Cc_3(t) = \alpha \cdot \{\max\{0, 0.75 \cdot [Vq_3(t) + Vq_3(t-1)] + 0.5, 0.25 \cdot [Vq_3(t) + Vq_3(t-1)] + 0.5\}[Vq_3(t) + Vq_3(t-1)]$
$- \max\{Vq_3(t), 0.25 \cdot Vq_3(t) + 0.75 \cdot Vq_3(t-1), 0.75 \cdot Vq_3(t) + 0.25 \cdot Vq_3(t-1), Vq_3(t-1)\}\}, 0 < \alpha < 1, \forall t$

FIG. 12B

Min-Sum update rule with correction factor (Example 7)

$Cc_2(t) =$
$= sgn[Vq_2(t)]sgn[Vq_2(t-1)]min(|Vq_2(t)|,|Vq_2(t-1)|) + LUT[|Vq_2(t)+Vq_2(t-1)|] - LUT[|Vq_2(t)-Vq_2(t-1)|] \cdot Vq_2$ where $$LUT(X) = \begin{cases} -X \cdot 0.5 + 0.7, & \text{if } (0.0 \leq X < 0.5) \\ -X \cdot 0.25 + 0.575, & \text{if } (0.5 \leq X < 1.6) \\ -X \cdot 0.125 + 0.375, & \text{if } (1.6 \leq X < 2.2) \\ -X \cdot 0.0625 + 0.2375, & \text{if } (2.3 \leq X < 3.2) \\ -X \cdot 0.03125 + 0.1375, & \text{if } (3.2 \leq X < 4.4) \\ 0.0, & \text{elsewhere} \end{cases}$$

$Cc_3(t) =$
$= sgn[Vq_3(t)]sgn[Vq_3(t-1)]min(|Vq_3(t)|,|Vq_3(t-1)|) + LUT[|Vq_3(t)+Vq_3(t-1)|] - LUT[|Vq_3(t)-Vq_3(t-1)|] \cdot Vq_3$ where $$LUT(X) = \begin{cases} -X \cdot 0.5 + 0.7, & \text{if } (0.0 \leq X < 0.5) \\ -X \cdot 0.25 + 0.575, & \text{if } (0.5 \leq X < 1.6) \\ -X \cdot 0.125 + 0.375, & \text{if } (1.6 \leq X < 2.2) \\ -X \cdot 0.0625 + 0.2375, & \text{if } (2.3 \leq X < 3.2) \\ -X \cdot 0.03125 + 0.1375, & \text{if } (3.2 \leq X < 4.4) \\ 0.0, & \text{elsewhere} \end{cases}$$

CONSTRUCTION OF MULTI RATE LOW DENSITY PARITY CHECK CONVOLUTIONAL CODES

RELATED APPLICATIONS

This application claims the benefit of U.S. Provisional Application No. 61/526,697, filed on Aug. 24, 2011, commonly owned and assigned to the same assignee hereof.

TECHNICAL FIELD

The present disclosure relates to communication systems and more specifically to communication devices having encoder and decoder blocks employing multi rate Low Density Parity-Check Convolutional Codes (LDPC CCs).

BACKGROUND

Error correcting codes are widely utilized in wireless communications. Error-correcting codes compensate for any intrinsic unreliability of transmitted information by introducing redundancy into a data stream. Considerable interest has recently grown in a class of codes known as low-density parity-check (LDPC) codes. LDPC codes have been demonstrated to provide error-rate performance close to channel capacity, which represents a lower bound for wireless transmissions.

Encoding of LDPC codes refers to a procedure that produces a codeword from a set of information bits by incorporating a certain number of redundant bits called parity bits. Rate of an LDPC code is defined as a ratio of a number of information bits and a total number of encoded bits (i.e. information bits and parity bits).

Emerging communication standards continuously evolve and they are required to operate under various channel conditions retaining high performance over a large range of time varying noise levels. A method that is frequently employed to achieve reliable and consistent transmission in communications systems is the use of forward error-correcting (FEC) schemes supporting variable code rates, thus ensuring high system performance in all operating modes. It is of particular interest that one single FEC scheme can operate, or support, a wide range of code rates, spanning from extremely low code rates (e.g., 1/5) for extremely low quality channel conditions, up to quite high rates (e.g. 9/10) for certain good quality channel conditions, in a consistent, hardware friendly manner, with minimal loss in overall system's performance.

There is a need for improved techniques for constructing LDPC codes capable of supporting multi-rate encoding across a range of code rates, from low to high, and which do not require significant computational complexity.

BRIEF DESCRIPTION OF THE DRAWINGS

FIG. 5 shows a channel encoder including an MR-LDPC-CC encoder based on a rate 1/2 binary LDPC-CC binary mother code according to an embodiment of the present invention.

FIG. 6 is an equation showing a syndrome former matrix $H^T$ of the mother code of rate equal to 1/2.

FIG. 7 shows an extended syndrome former matrix $eH^T$ of the MR-LDPC-CC encoder of FIG. 5.

FIGS. 12A to 12C identifies a set of different message passing techniques.

FIG. 16 is a table showing memory and hardware resource requirements for a decoder operating on $eH^T$ and a proposed MR-ALDPC-CC decoding algorithm that operates based on $H^T$.

SUMMARY

The present disclosure is directed to a device that allows the construction of multi-rate accumulative LDPC convolutional codes (LDPC CCs) based on a mother code with an arbitrary code rate. Related methods for constructing the multi-rate ALDPC-CCs are also disclosed. In one embodiment the multi rate ALDPC-CC includes an encoder for generating a first part of a codeword according to an LDPC code having a first code rate. A plurality of programmable accumulators is coupled to the encoder. The parity bit sequence produced at the output of the programmable accumulators is combined with the first part of the codeword to generate the codeword. The codeword has a second code rate that is lower than the first rate of the LDPC code. The second code rate is defined by the number of accumulators being enabled to connect to the encoder. Puncturing and rate matching techniques can further adjust the coder rate of the second codeword to a higher rate.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Figure 1:
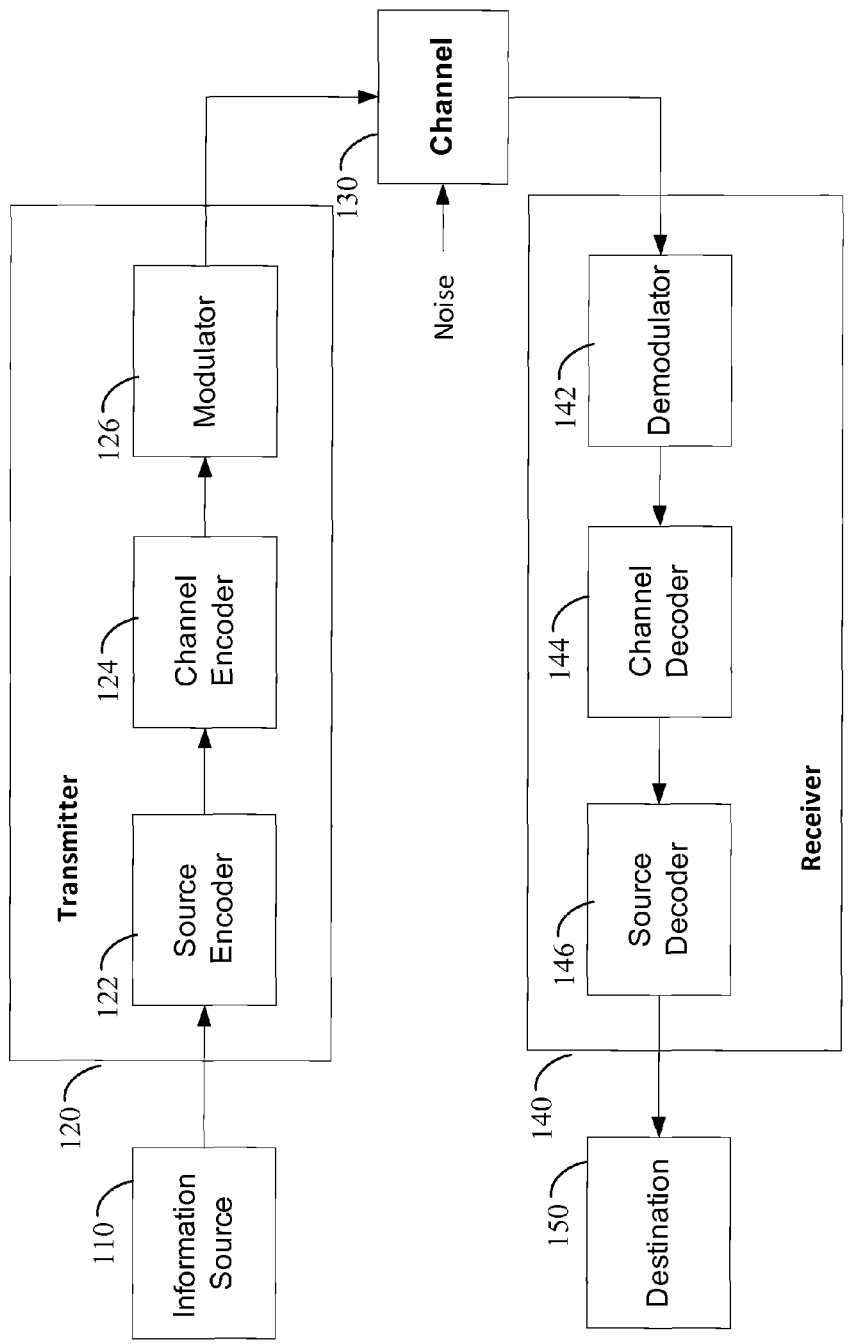
FIG. 1 shows an exemplary communication system.

FIG. 1 shows an exemplary communication system 100. Information Source 110 provides Transmitter 120 with source data. Transmitter 120 includes Source Encoder 122 coupled to Channel Encoder 124 coupled to Modulator 126. Source Encoder 122 receives source data from information source 110 and encodes the source data to generate encoded data. Channel Encoder 124 receives encoded data from Source Encoder 122 and generates Channel data. Modulator 126 receives Channel data from Channel Encoder 124 and generates Modulated data. Modulated data is transmitted over Channel 130. Channel 130 may be a wireless or wired communication channel. Channel 130 is prone to noise. Noise is added to modulated data over Channel 130. Receiver 140 receives noisy data comprising modulated data and noise. Receiver 140 includes Demodulator 142 coupled to Channel Decoder 144 coupled to Source Decoder 146. Demodulator 142 receives the noisy data and demodulates the noisy data to generate demodulated data. Channel decoder 144 receives demodulated data from Demodulator 142 and generates Channel data. Source decoder 146 receives channel data from Channel Decoder 144. Source Decoder 146 decodes the channel data and generates the source data originally provided to Transmitter 120. Receiver 140 is coupled to Destination 150 to provide Destination 150 with the source data.

As is known by Shannon's code theory, it is possible to reduce the possibility of error reception through a noisy channel provided that the transmission rate does not exceed the channel capacity. More specifically, for a channel having bandwidth (B) and signal-to-noise ratio (SNR), the channel capacity (C), i.e. the maximum error-free transmission rate, in bits per second (BPS) is given by:

$$C = B \log_2(1 + SNR) \quad \text{(Equation 1)}$$

By properly encoding of data, errors can be minimized to whatever level is desired without reducing the transmission rate. Nevertheless, the lower the desired error rate is the more complex the required encoding shall be.

The purpose of channel encoding is to minimize the possibility of erroneous transmission. The error correcting code used as well as the encoding-decoding processes define to a large extent the system throughput. Error correcting codes are split into two large categories: Block Codes and Convolutional Codes.

Block Codes are characterized by the segmentation of data to be transmitted into K symbol length blocks and corresponding N symbol length blocks called codewords, where N≥K. A block code is considered linear if each linear combination of two codewords is also a codeword.

The transformation of a K bit length sequence (K data) to an N bit length sequence (codeword) is accomplished with the help of a K×N binary matrix called Generator Matrix (G). The code-word ($c_i$) is generated by multiplying the K data with the matrix G.

$$c_i = u_j \otimes G \quad \text{(Equation 2)}$$

Low-Density Parity Check (LDPC) codes are a subcategory of linear block codes. LDPC codes are characterized by an LDPC parity check matrix (H) and a corresponding Tanner graph. Decoding is performed through an iterative process of information exchange between two processing unit types.

For LDPC codes an LDPC matrix H must fulfil the following equation:

$$c_i \otimes H^T = 0 \quad \text{(Equation 3)}$$

In a conventional channel encoder, the channel encoder receives an information sequence of b bits to which a redundancy sequence of r bits is added thereby producing an encoded sequence of c bits. The code-rate R is defined as the ratio between the number of information bits b and the number of encoded bits c, thus R=b/c, where b is less than c. The encoded bits are modulated into symbols and then transmitted across a communication channel. At the receiving end, a receiver demodulates the received symbol sequence producing the appropriate soft (or hard) values that corresponds to each one of the transmitted encoded bits. A decoder uses the redundancy in the received sequence of encoded transmitted bits, represented by either soft or hard values, to correct for errors in the information sequence of the received sequence of bits. In turn, a decoded signal is produced which is an estimate of the transmitted information sequence of bits.

A code rate R binary LDPC convolutional code can be defined as the set of sequences, $v_{[0,\infty]} = (v_0, v_1, \ldots)$, $v_t = (v_t^{(1)}, v_t^{(2)}, \ldots, v_t^{(c)}) \in GF(2)$, satisfying $v_{[0,\infty]} H_{[0,\infty]}^T = 0$, where the semi-finite syndrome former matrix $H_{[0,\infty]}^T$ is given by Equation 4:

$$H_{[0,\infty]}^T = \begin{bmatrix} H_0^T(0) & H_1^T(1) & \ldots & H_{m_s}^T(m_s) & & \\ & H_0^T(1) & H_1^T(2) & \ldots & H_{m_s}^T(m_s+1) & \\ & & \ddots & & & \ddots \\ & & & H_0^T(t) & \ldots & H_{m_s}^T(t+m_s) \\ & & & & \ddots & & \ddots \end{bmatrix} \quad \text{(Equation 4)}$$

For binary LDPC-CCs, each entry is a c×(c−b) binary matrix denoted as:

$$H_i^T(t) = \begin{bmatrix} h_i^{(1,1)}(t) & \ldots & h_i^{(1,c-b)}(t) \\ \vdots & & \vdots \\ h_i^{(c,1)}(t) & \ldots & h_i^{(c,c-b)}(t) \end{bmatrix} \quad \text{(Equation 5)}$$

where i=0, ..., $m_s$ and at least for one time-instant t, we have $H_{m_s}^T(t) \neq 0$. For non-binary LDPC-CCs $H_i^T(t+i) \in GF(q=2^p)$, where p≥2. A code is systematic if matrices $H_0^T(t)$ have full rank for all time instances t, achieved by ensuring that the last (c−b) rows of $H_0^T(t)$ are linearly independent for all t. Then, the first b symbols of the sequence $v_i$ at each time instant t are the information symbols, and the last (c−b) symbols are the parity symbols. The largest i such that $H_i^T(t+i)$ is a non-zero matrix for some time instance t is called the syndrome former memory $m_s$ and $v_s=(m_s+1)c$ is the associated constraint length. These parameters determine the span of the nonzero diagonal region of $H^T$. The sparsity of the syndrome former is ensured by demanding that the Hamming weights of its columns are much smaller than $v_s$. The matrix $H_i^T(t)$ has the following properties:

a) $H_i^T(t)=0$, for i<0 and i>$m_s$,
b) There is at least one time instant t such that $H_{m_s}^T(0)=0$, and
c) $H_0^T(t)\neq 0$, $\forall t$ has full rank equal to (c−b), which can be fulfilled by its last (c−b) rows to be linearly independent.

Theoretically, all sub-matrices $H_i^T(t)$, t=0, 1, . . . can be different. In this case, the LDPC-CC is called time varying. In practical situations however, it is preferable to have some kind of periodicity in the structure of $H_{[0,\infty]}^T$.

Therefore, we define a periodic time-varying LDPC-CC as follows: An ($m_s$,b,c)-LDPC-CC is called time-variant with period T if $H_i^T(t)=H_i^T(t+T)\forall t,i$, while an ($m_s$,b,c)-LDPC-CC is called time-invariant if T=1.

The present disclosure is generally directed to techniques for constructing LDPC convolutional codes (LDPC-CCs) to support multi-rate encoding and decoding of voice and data communications over a radio channel in a communication system.

The proposed invention will now be described in connection with the following description and the accompanying figures referenced therein.

Figure 2:
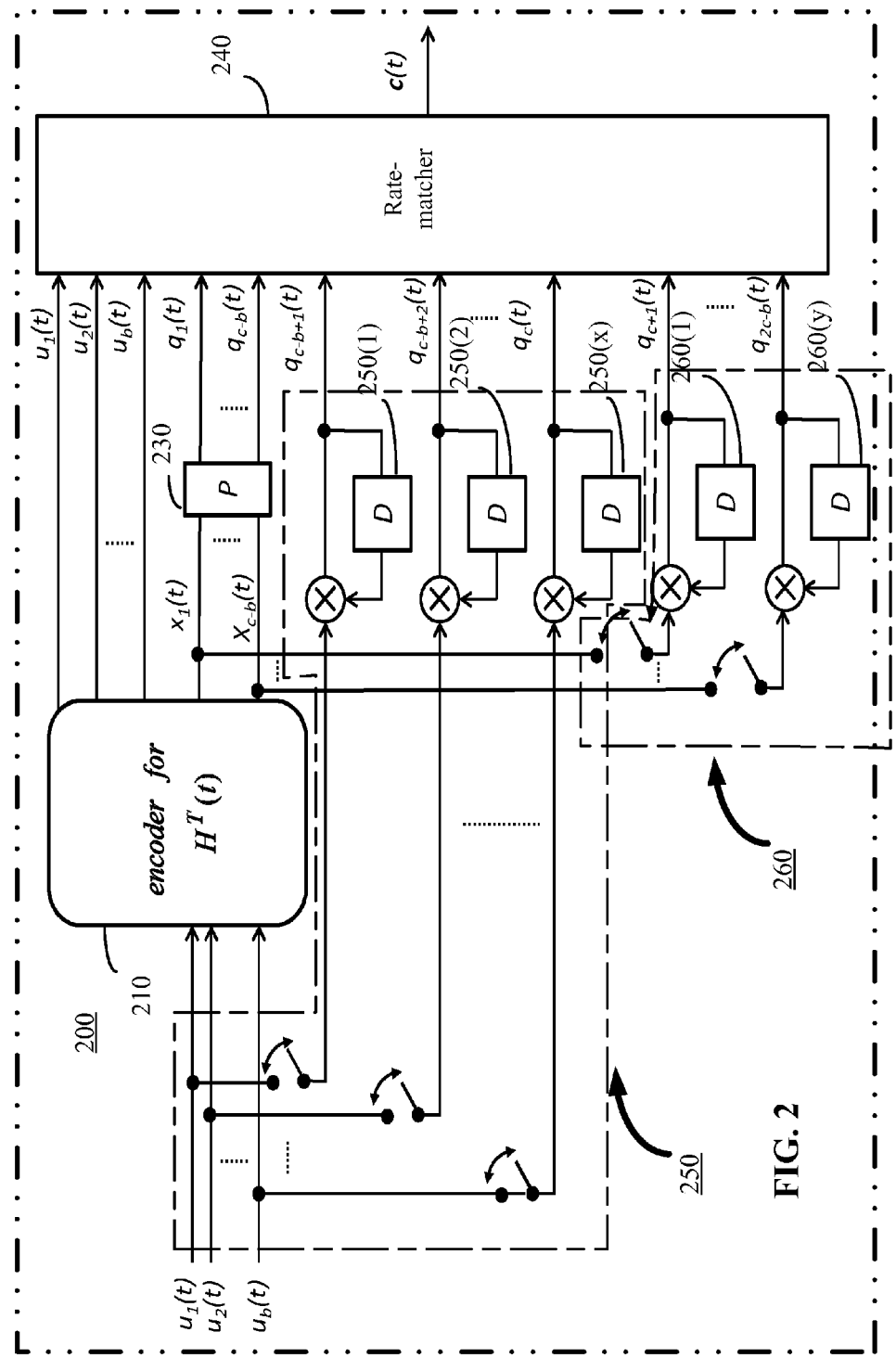
FIG. 2 is a block level diagram of a multi-rate low density parity check convolutional code (MR-ALDPC-CC) encoder in accordance with a first exemplary embodiment.

FIG. 2 is a block level diagram of multi-rate LDPC-CC (MR-ALDPC-CC) encoder 200 in accordance with a first exemplary embodiment. As shall be descrived herein, encoder 200 may substitute for channel encoder 124 of FIG. 1.

MR-ALDPC-CC 200 includes LDPC-CC encoder 210, puncturing unit 230, rate matcher 240, and first and second sets of programmable accumulators, represented by hash lines 250 and 260, respectively.

LDPC-CC encoder 210 produces a parity bit sequence $x_1(t)$ to $x_{c-b}(t)$ and is connected to programmable accumulators 250 which consist of accumulators 250(1), 250(2) . . . 250(x) and programmable accumulators 260 which consist of accumulators 260(1) . . . 260(y). The accumulator reference designations (x) and (y) are employed to reflect that any desired number of accumulators may be connected without departing from the scope of the invention as explained further below.

Programmable accumulators 250, as shown, feed into respective inputs of LDPC-CC encoder 210, while programmable accumulators 260 directly couple to the output of LDPC-CC encoder 210 and receive as input the parity bit sequence $x_1(t)$ to $x_{c-b}(t)$ generated by LDPC-CC encoder 210.

In all instances, conventional puncturing and rate matching may be employed to further increase the code rate of the codeword generated in accordance with the exemplary embodiments described herein.

In accordance with an exemplary embodiment, a first part of a codeword is generated using LDPC convolutional coding together with a mother code. The mother code is also an LDPC-CC set to an initial code rate.

A second part of the codeword—comprised of a sequence of parity bits—is produced by the output of accumulators.

The second part uniquely combines with the first part to generate the final complete codeword. The code rate of the final codeword is lower than the code rate of the first part of the codeword.

The code rate of the final codeword is a function of the number of accumulators enabled at any one time.

LDPC-CC encoder 210, as configured, receives a number of b information bits and generates a number of c-b parity bits according to a mother LDPC-CC. The LDPC-CC encoder encodes the b information bits using a syndrome former matrix $H^T(t)$, also called the mother matrix. The LDPC-CC encoder produces codewords of length c and a code-rate of R=b/c. Accumulators produce an additional number of parity bits. The number of additional parity bits is equal to the number of accumulators that are enabled and thus connected either to the input of the LDPC-CC encoder or to its output. The additional parity bits are combined with the codewords produced by the LDPC-CC encoder. In this way, new codewords with a code rate lower than R may be produced. Taking as example a scenario where (k) number of accumulators are enabled, the corresponding "new" code rate may be represented as $R_{new}$=b/(c+k), where k can take any value from 1 to c.

Puncturing unit 230 is coupled to the output of LDPC-CC encoder 210 and receives as input the parity bit sequence $x_1(t)$ to $x_{c-b}(t)$ generated by LDPC-CC encoder 210. Puncturing unit 230 applies a puncturing pattern to erase a number of bits from the parity bit sequence $x_1(t)$ to $x_{c-b}(t)$. As configured, the code rate of new codewords is increased.

Rate matcher 240 is coupled to the input of LPDC-CC encoder 210, to the output of puncturing unit 230 and to the outputs of programmable accumulators 250, 260. Rate matcher can operate to increase the code rate of new codewords, to a desired higher rate. The output c(t) of the rate-matcher is a vector with length that varies from 1 bit to 2c bits per time instant depending on the desired code-rate.

Those of skill would appreciate that any suitable puncturing and/or rate matching technique may be applied to the new codewords to further adjust code rate.

Figure 3:
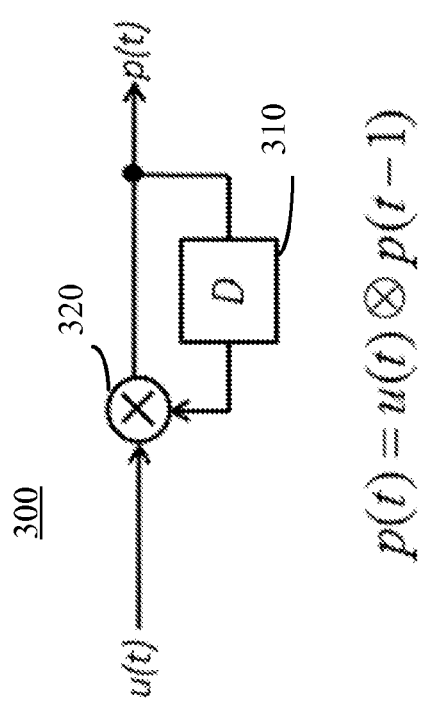
FIG. 3 depicts in block diagrammatic form a configuration of a single exemplary accumulator 300.

FIG. 3 depicts in block diagrammatic form a configuration of a single exemplary accumulator 300. Accumulator 300 comprises a D flip-flop 310 (or equivalently a one bit memory element) and an XOR gate 320. The output p(t) of accumulator 300 is derived from the input u(t) of the accumulator according to Equation 3.

$$p(t)=u(t)\otimes p(t-1) \quad \text{(Equation 3)}$$

Figure 4:
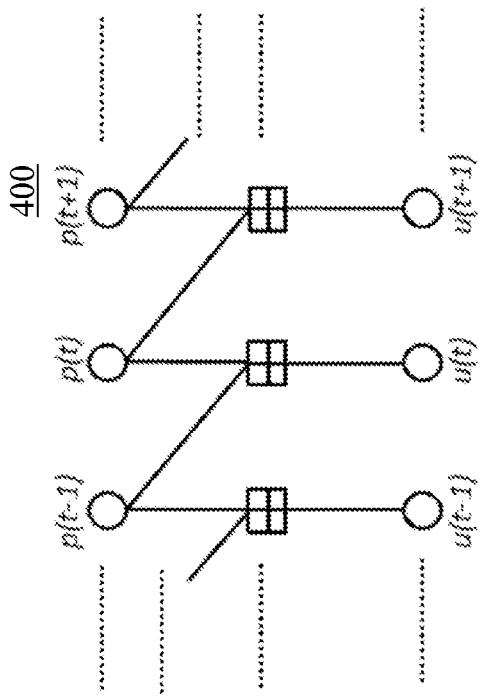
FIG. 4 is a Tanner graph 400 of accumulator 300.

FIG. 4 is a Tanner graph 400 of accumulator 300. A Tanner graph is a bipartite graph with vertex set V=V1∪V2, where each edge has one endpoint in V1 and one in V2. The specific Tanner graph of accumulator 300 consists of Check nodes (vertex set V1) of degree 2 and variable nodes (Vertex set V2) of degrees 1 and 2. Here, the connectivity between variable and check nodes maintains a cause and effect relation (meaning that a variable node can connect to a check node only at present and future time instants).

The Tanner graph is concatenated upon the corresponding variable node of the Tanner graph of the mother code on the basis of which codeword bit of a certain predefined mother code an accumulator is associated with.

Figure 5:
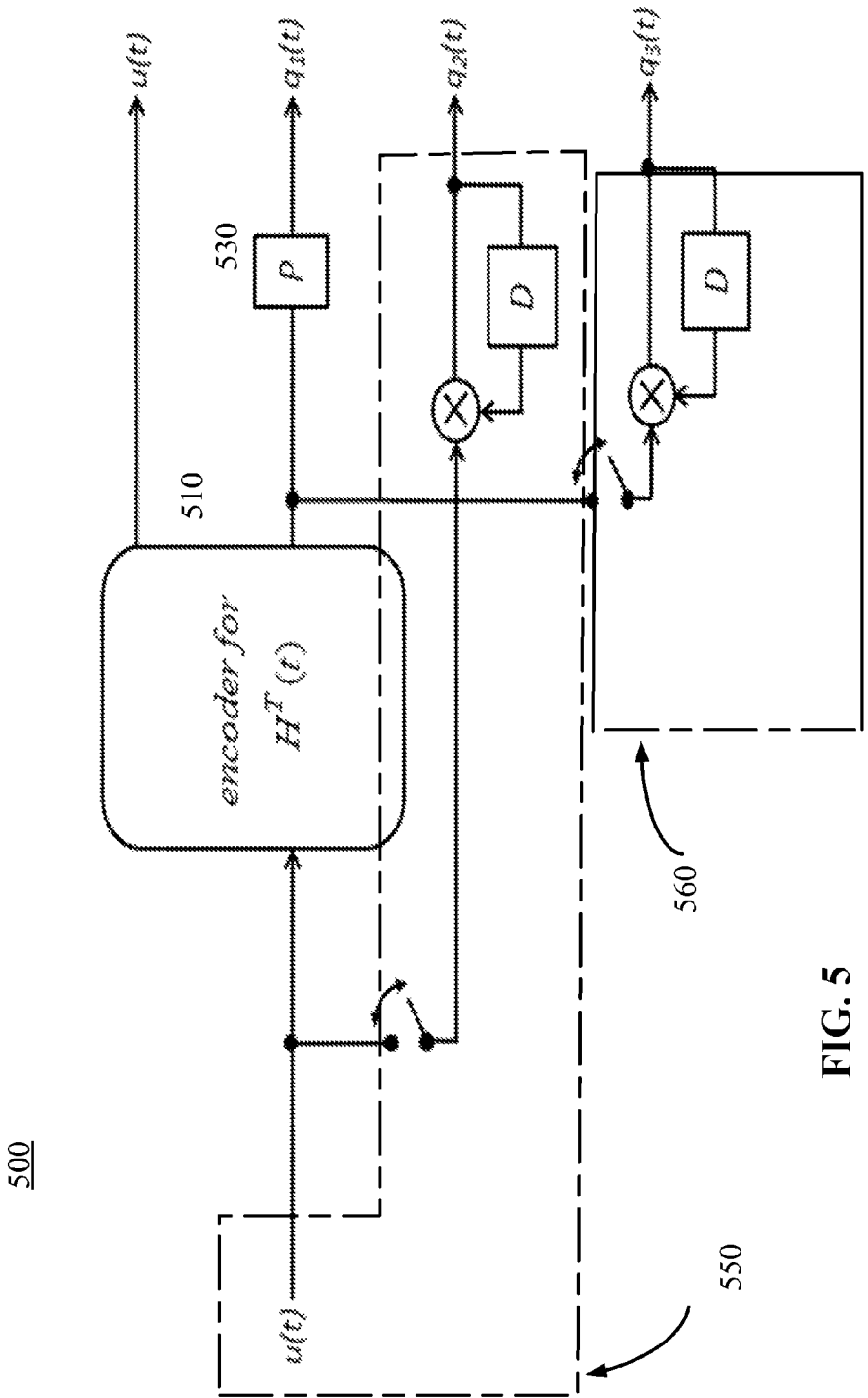
FIG. 5 depicts the error correcting performance of the proposed MR-ALDPC-CC for the termination schemes 1 and 2.

FIG. 5 shows a channel encoder 500 including a multi-rate LDPC-CC encoder 510 based on a rate 1/2 binary LDPC-CC binary mother code according to an embodiment of the present invention.

Multi-rate LDPC-CC encoder is coupled to puncturing unit 530, and to two accumulators 550, 560. Accumulator 550 is coupled to the input of LDPC-CC encoder 510. Accumulator 560 is coupled to the output of LDPCC-encoder 510. The LDPC-CC encoder receives information bit sequence u(t) and generates parity bit sequence $x_1(t)$. Accumulator 550 receives information bit sequence u(t) and generates parity bit sequence $q_2(t)$. Accumulator 560 receives parity bit sequence $x_1(t)$ and generates parity bit sequence $q_3(t)$. Puncturing unit 530 operates on parity bit sequence $x_1(t)$ to produce parity bit sequence $q_1(t)$.

Figure 6:
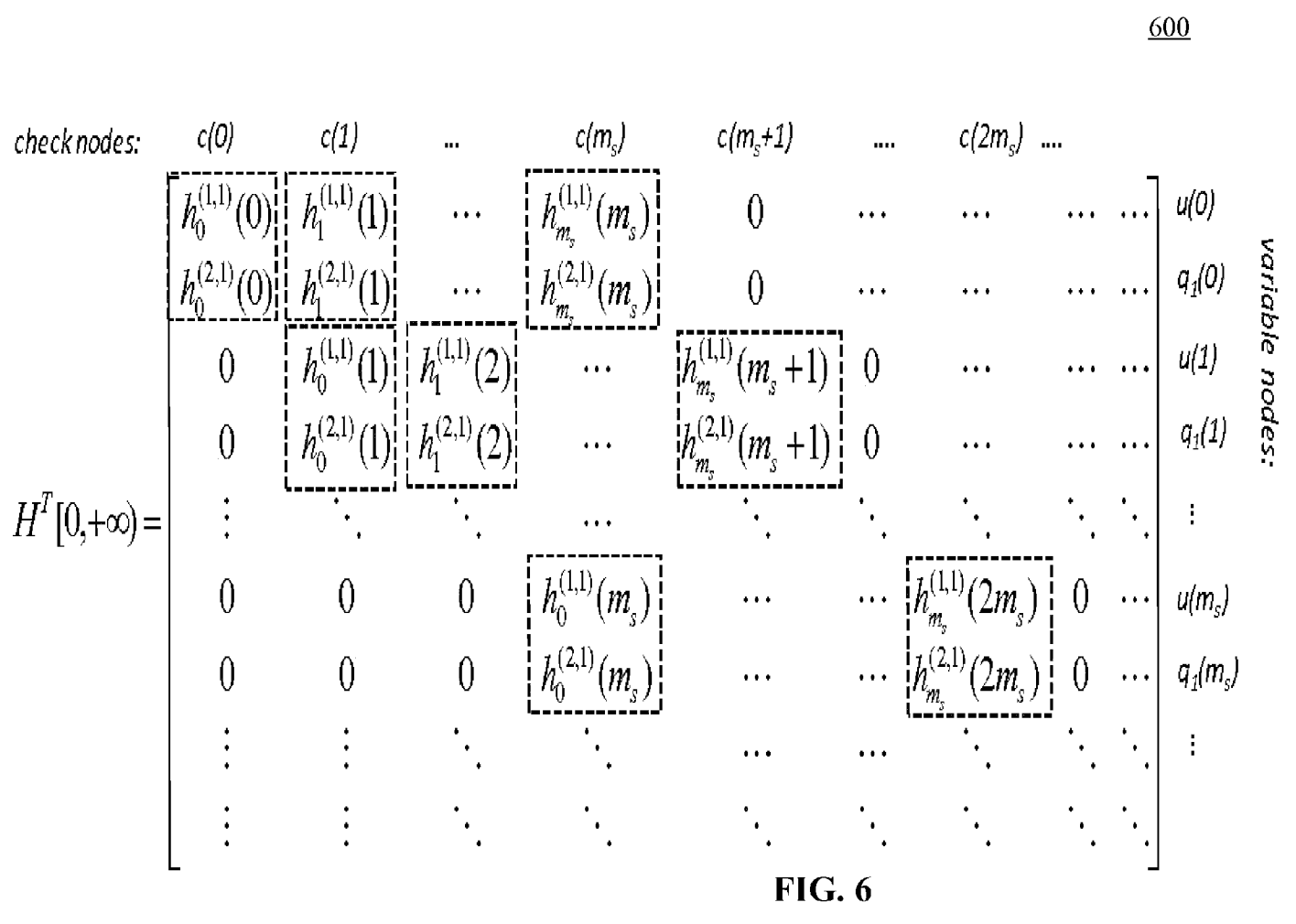

The syndrome former matrix $H^T$ of the mother code of rate equal to 1/2 is given by equation 600 shown in FIG. 6.

Referring to FIG. 6, each element $H_i^T$ is a $c \times (c-b) = 2 \times 1$ submatrix (c=2, b=1). The matrix is expressed in generic matrix elements. Specific values of the elements of the matrix are not of particular importance.

When one of the accumulators 550, 560 is enabled a new codeword with code rate of 1/3 is generated. When both accumulators 550, 560 are enabled, a new codeword with code rate of 1/4 is generated. In both cases, puncturing unit 530 is disabled.

When puncturing unit 530 is enabled then the code rate of the resulting codeword may be further increased.

A rate matcher (not shown) may be used to receive the sequences u(t), $q_1(t)$, $q_2(t)$, $q_3(t)$ to produce an output vector c(t), the length of which varies from 1 bit to 4 bits depending on the specified coding-rate.

The channel decoder of FIG. 5 may be associated with an extended version of the mother matrix, called enhanced syndrome former matrix and denoted as $eH^T$. $eH^T$ is a matrix extended to include the check and variable node connectivity information associated with the number of accumulators connected to either the input or the output of an LDPC-CC encoder.

Figure 7:
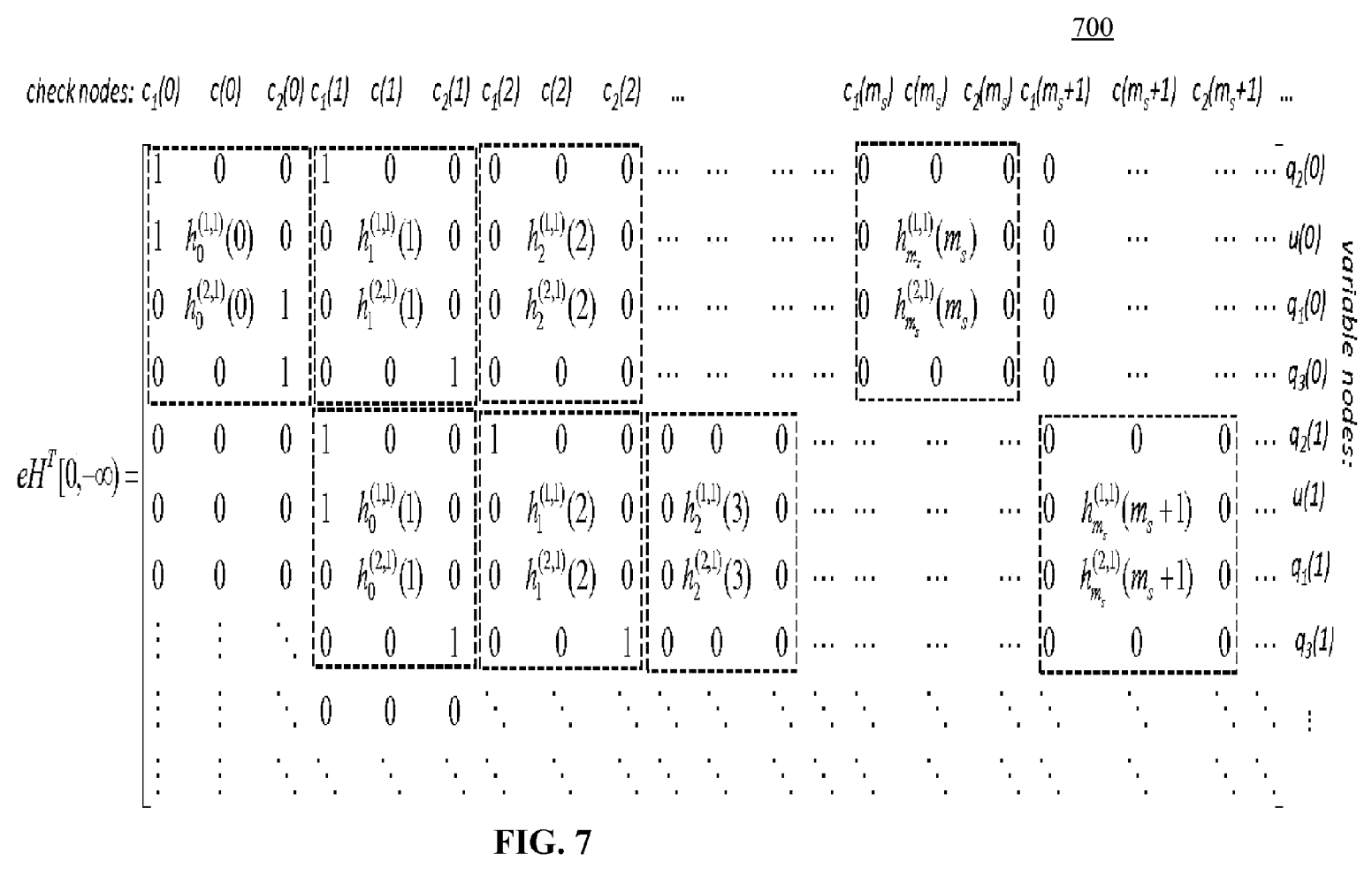

An extended syndrome former matrix $eH^T$ (700) of the multi-rate LDPC CC encoder of FIG. 5 is shown in FIG. 7.

Here, each of the $eH_i^T$ submatrices are of size $c_{new} \times (c_{new} - b_{new}) = 4 \times 3$ ($C_{new} = 4$, $b_{new} = 1$) and incorporates the corresponding $H_i^T$ submatrix of the mother code.

Figure 8:
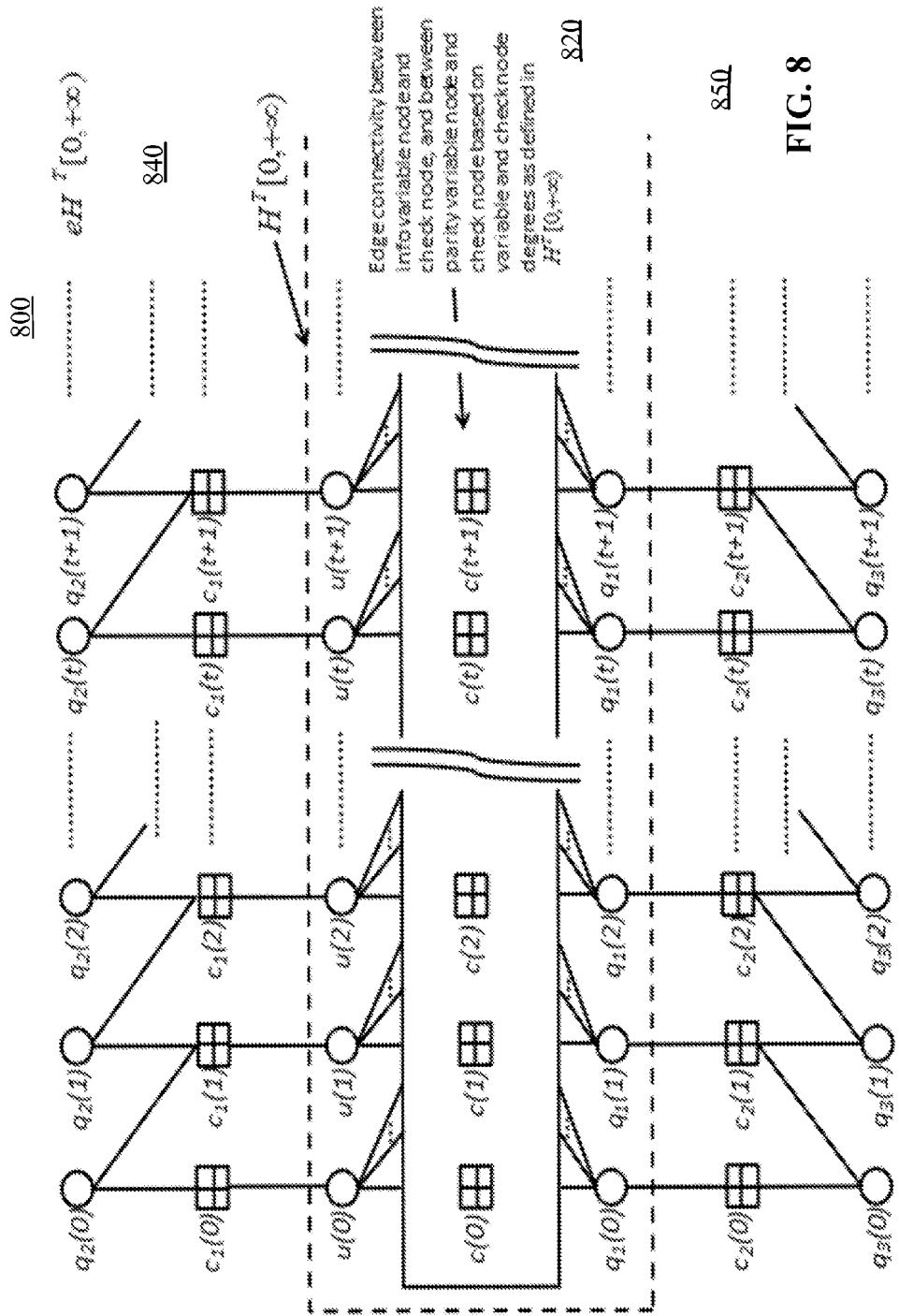
FIG. 8 is an illustration of a Tanner graph in accordance to an embodiment of the extended matrix $eH^T$ described in connection with FIG. 7.

FIG. 8 is an illustration of a Tanner graph 800 in accordance to an embodiment of the extended matrix $eH^T$.

Tanner graph 800 of the extended matrix $eH^T$ unifies mother matrix $H^T$ with the Tanner graphs of the accumulators that are enabled. The Tanner Graph of $eH^T$ comprises three parts. The first part, the central part 820, corresponds to the Tanner Graph of the mother code. The second part, the upper part 840, corresponds to the accumulator connected to the u(t) info bits and generates the $q_2(t)$ parity bits. The existing variable node corresponding to u(t) is connected to the new variable node corresponding to $q_2(t)$, via a check node at the current time instant and one time instant in the past. The third part, the lower part 850, corresponds to the accumulator connected to the existing parity bit $q_1(t)$ and the new parity bit $q_3(t)$. The existing variable node corresponding to $q_1(t)$ is connected to the new variable node corresponding to $q_3(t)$, via a check node at the current time instant and one time instant in the past.

The LPDC-CC codes associated with the $eH^T$ matrix are called Accumulative LDPC-CCs (ALDPC-CCs). ALDPC-CCs that employ a puncturing unit and/or a rate-matching device are called Multi-Rate ALDPC-CCs (MR-ALDPC-CCs)

Other formations of the $eH^T$ may be derived taking always into account the structure of the corresponding Tanner Graph. It is noted that an equivalent code is produced by permuting the rows in the extended syndrome former.

An analysis of Tanner graph 800 of FIG. 8 follows.

The Tanner Graph 800 reveals that accumulators incorporate parity check nodes $c_1$ and $c_2$ of degree 3. Parity check nodes $c_1$ and $c_2$ at time index t=0 have a degree of 2. Variable nodes $q_2$ and $q_3$ have degrees equal to 2 (dv=2).

In the case where mother matrix $H^T$ is regular, $eH^T$ is also regular. This property allows us to simplify decoding functions.

It is noted that the minimum girth of the $eH^T$ is equal to six if and only if the girth of the basic LDPC-CC code ($H^T$) is not equal to four, and there are edges in the Tanner Graph representation that connect a check node belonging to the $H^T$ with two consecutive in time variable nodes belonging to $H^T$ and are of the same category.

It is also noted that the number of the small stopping sets of the MR-ALDPC-CC equals to the number of the small stopping sets of the mother LDPC-CC.

It is further noted that the memory order and the period of the MR-ALDPC-CC are equal to the memory and the period of the mother LDPC-CC code, respectively.

The above indicate the following important properties of the MR-ALDPC-CCs.

The girth of the MR-ALDPC-CC may be equal to the girth of the mother LDPC-CC code when the girth of the latter is appropriately selected. This results in avoiding error-floors and in exhibiting superior error-correcting behavior.

The properties of the mother LDPC-CC code in terms of small stopping sets are those ones that determine the error-correcting behavior of MR-ALDPC-CCs in the error-floor region.

The proposed Multi-Rate LPDC-CC construction techniques allow the derivation of Multi-Rate LPDCC-CC codes that inherit the properties of the mother LPDC-CC codes.

The proposed MR-ALDPC-CC does not require termination when the mother code is a LDPC-CC that employs tailbiting and as a result no rate loss is introduced. In the case that the $H^T$ is not producing a tailbiting code, then two alternative termination schemes could be employed in order to avoid degradation at the error-correcting performance of the MR-ALDPC-CCs for frame-based applications.

The first scheme, scheme 1, requires a number L of termination bits to be appended to the K transmitted information bits. In this case, a channel encoder can be safely flushed and re-initialized to the all-zero state before starting encoding the next frame. Consequently, for LDPC CC code with rate of R=b/c, the effective code rate is $R_e = K/(K+P+c \times L)$, where P is the number of the transmitter parity bits. The overhead in the transmission is c×L bits. It should be noted that some LDPC-CCs cannot be terminated at the all-zero state and consequently this scheme cannot be applied to these cases. As a rule of thumb L should be chosen as $L > 10 (m_s + 1)$.

A second termination scheme, scheme 2, refers to the termination of the mother LDPC-CC encoder to a steady state by appending a sequence of zero bits, having a length L, at the end of the information bit sequence. Typically the length L is equal to the constraint length $v_s$, of the mother code or is equal to 15% to 20% of a transmission frame length. For an LDPC-CC code of rate b/c, the additional overhead to the codeword length is (c−b)×L because the zeros appended to the information bits are not transmitted. In this case, the effective code-rate is given by $R_e = K/(K+P+(c-b)L)$, where K is the number of transmitted information bits and P is the number of transmitted parity bits.

The effective code rate can be further improved if only the parity bits produced by the mother LDPCC-CC code are transmitted. In this case, the parity bits produced by the accumulators are not transmitted over the channel. As a result, the effective code becomes $R_e = K/(K+P+L)$ and the rate-loss is thus limited to L bits, which is less than the rate-loss of the mother LDPC-CCs of the same coding-rate. The decoder assigns the Log-Likelihood Ratios (LLR) values of the not transmitted parity bits of the accumulators to be equal to the value corresponding to absolute reliability of receiving a zero or one, and this value is kept constant during the decoding procedure. This is due to the fact that the L zero info bits produces either L zero output bits if the previous state of the accumulator is zero and L ones in case that the previous state is one. Simulation results have shown that there is not penalty in the error-correction capability of the code.

Let's turn next back to the multi-rate LDPC-CC configuration of FIG. 5 and let us assume a termination method involving appending a sequence of L zero bits at the end of the information bits is used for the MR-LDPC-CC code to arrive at a code rate of 1/4. In a conventional LDPC-CC, the effective code rate according to scheme 2 would have been $R_e=K/[K+P+3 \times L]$ and the rate-loss $3 \times L$ bits respectively. However, with the presently proposed approach, because tail parity bits produced by the accumulators are not sent over the channel, the effective code rate is $R_e=K/(K+P+L)$ and the rate-loss is L bits.

Figure 9:
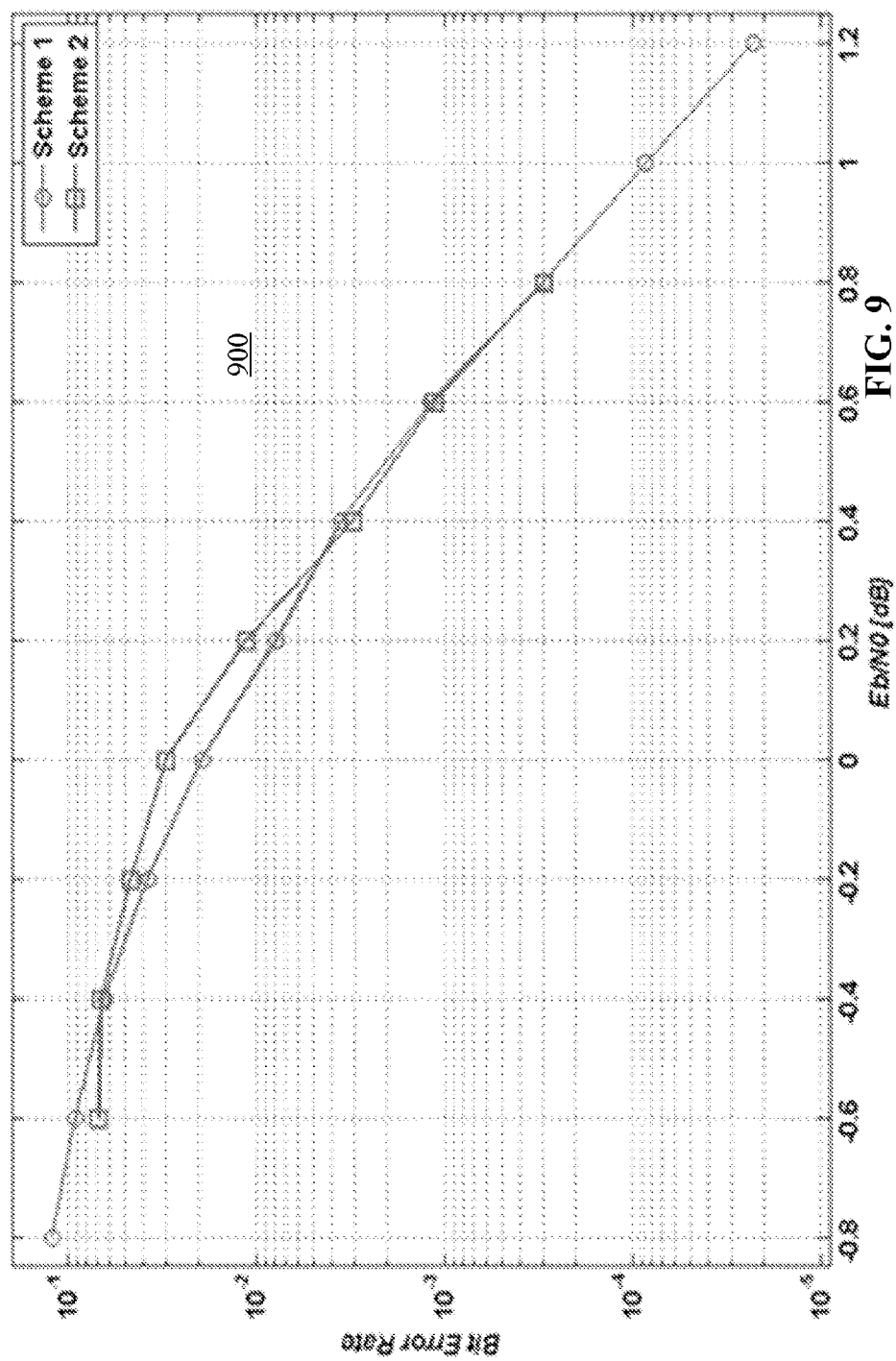
FIG. 9 depicts error correcting performance of a proposed MR-ALDPC-CC comparing two schemes.

FIG. 9 depicts error correcting performance 900 of the proposed MR-ALDPC-CC for scheme 1 and scheme 2 just described. It can be seen that scheme 2 doesn't exhibit performance degradation with respect to scheme 1 and consequently there is no performance penalty of MR-ALDPC-CC when termination is incorporated for the case of frame-based transmission.

Figure 10:
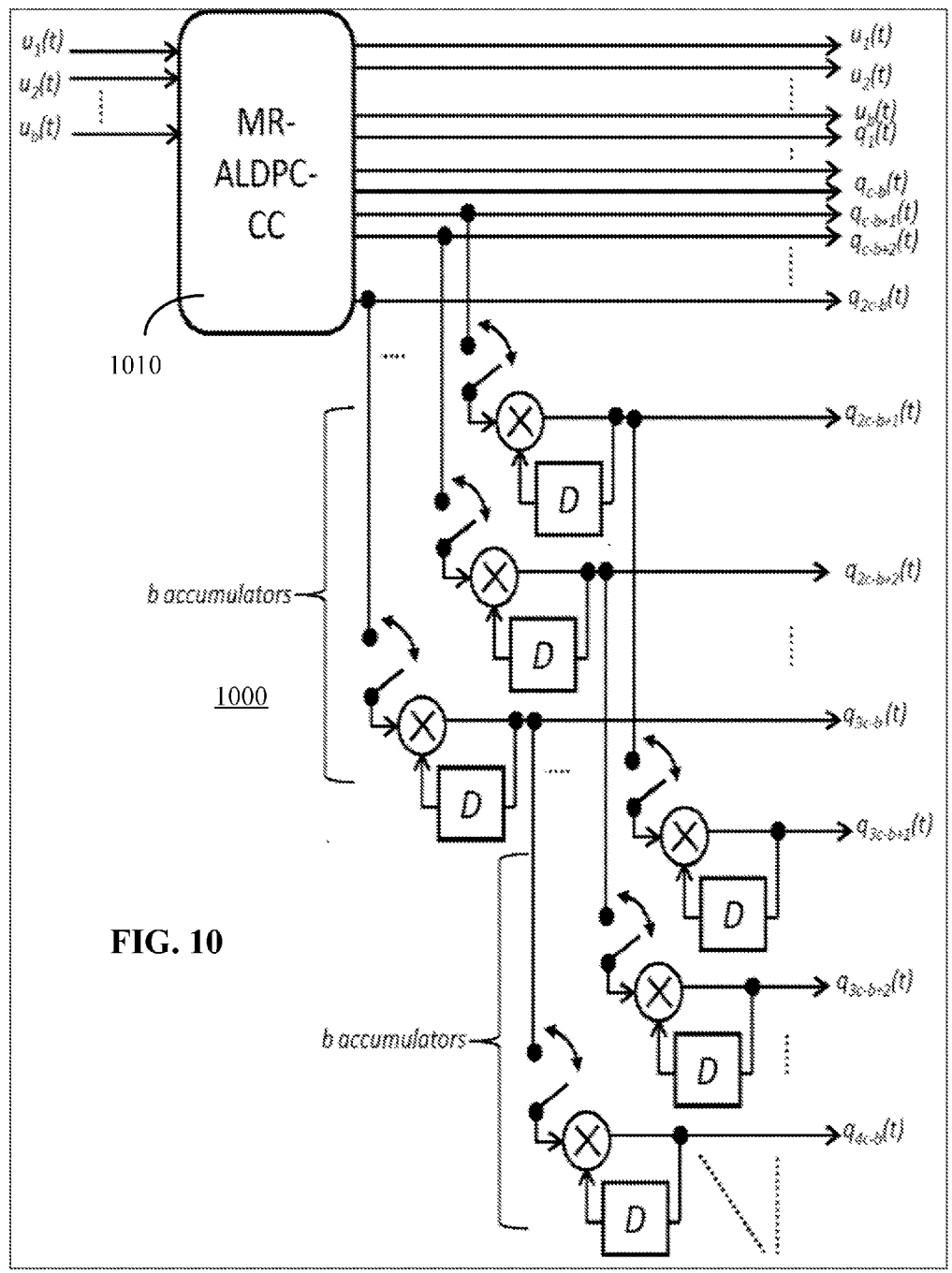
FIG. 10 shows an alternate further exemplary embodiment of a channel encoder including an MR-ALDPC-CC encoder configured to support very low code rates.

FIG. 10 shows an alternate further exemplary embodiment of a channel encoder 1000 including an MR-ALDPC-CC encoder 1010 configured to support very low code rates. MR-ALDPCC-CC encoder 1010 is coupled to a plurality of programmable accumulators. A second-in-order set of accumulators receives the parity bits generated by a first-in-order set of accumulators coupled to the output of MR-ALDPC-CC encoder 1050 to generate a word of parity bits, $q_{2-b+1}(t)$ to $q_{2c-b}(t)$. Each subsequent-in-order set of accumulators receives as an input the output of the previous-in-order set of accumulators. In this manner, MR-ALDPC-CC encoder 1010 of FIG. 6 is able to achieve a code rate with a lower bound of $R=b/(2 \cdot c+n \cdot c)$, where n denotes the number of sets of accumulators used, and b is the number of accumulators per each set of accumulators of the n set of accumulators used.

It is apparent that a rate matcher (not shown) may be coupled at the output of MR-ALDPCC-CC encoder 1010 of FIG. 10 to receive the info bits-$u_1(t) \ldots u_b(t)$ and the parity bits—$q_1(t) \ldots q_{4c-b}(t)$ and produce an output vector.

In yet a further embodiment, shortening schemes are employed. A combination of the two schemes discussed above is employed subject to the following rules of operation:

a) zero tail bits of appropriate length are used to terminate an MR-ALDPC-CC encoder and not sent over any channel; and b) all parity bits produced by feeding such tail bits to the encoder are sent over the channel.

The following example illustrates the construction of low-rate MR-ALDPC-CC employing shortening schemes. The construction of an MR-ALDPC-CC with code rate of 1/5, having an information sequence with a length of 424 bits, based on a mother LDPC-CC code with code rate of 1/2 is presented. As for encoder type, a multi-rate LDPC-CC encoder as in FIG. 5 is used to construct a MR-ALDPC-CC with code rate of 1/4.

In the exemplary scenario, a desired codeword length of 2120 bits (424×5) is selected. A multi rate encoder operating at mode code rate 1/4 will produce a codeword with a length equal to 1696 bits. An additional number of 424 parity bits is necessary to produce the required codeword of 2120 bits.

A 1/4 MR-ALDPC-CC code produces a codeword with length approximately equal to 2260 bits, when 565 information bits are used (424 bits+141 bits), from which if the 141 bits are not transmitted, a codeword of 2260−141=2119 bits is derived which is close to the desired codeword length. Consequently, taking into account that zero-tail bits are required to be appended to the end of the information bits in order to terminate the encoder (and increase the error correcting performance of the code), 141 zero bits (shortened bits) are attached at the end of the 424 information bits, but these are not transmitted over the channel. This means that the rate 1/4 MR-ALDPC-CC encoder produces a frame-length of 2119 bits (4×565−141=2119 bits) while in the same time it is terminated (through the help of the 141 zero bits), as required, to a steady state. Therefore, the effective rate of the MR-ALDPC-CC code is equal to $R_e=424/2119=0.2=1/5$.

The subject example illustrates that by performing shortening on the rate 1/4 MR-ALDPC-CC, a rate 1/5 MR-ALDPC-CC code can be constructed without rate-losses. If the specified error-correcting performance is not achieved, extra zero bits could be used and for such extra bits only the parity bits will be transmitted that were produced by the basic LDPC-CC code. This results in negligible rate-loss.

The 1/4 MR-ALDPC-CC decoder has knowledge of the shortened bits length, and assigns the LLR values to be equal to the value corresponding to absolute reliability of receiving a zero. This value is kept constant during the decoding procedure. Therefore, we have shown that a shortened MR-ALDPC-CC code of rate equal 1/4 can be used to encode and decode a 1/5 MR-ALDPC-CC.

Those of skill would appreciate that extending the 1/2 rate encoder of FIG. 5 to other rates and non-binary LPDC-CC coding is possible.

Figure 11:
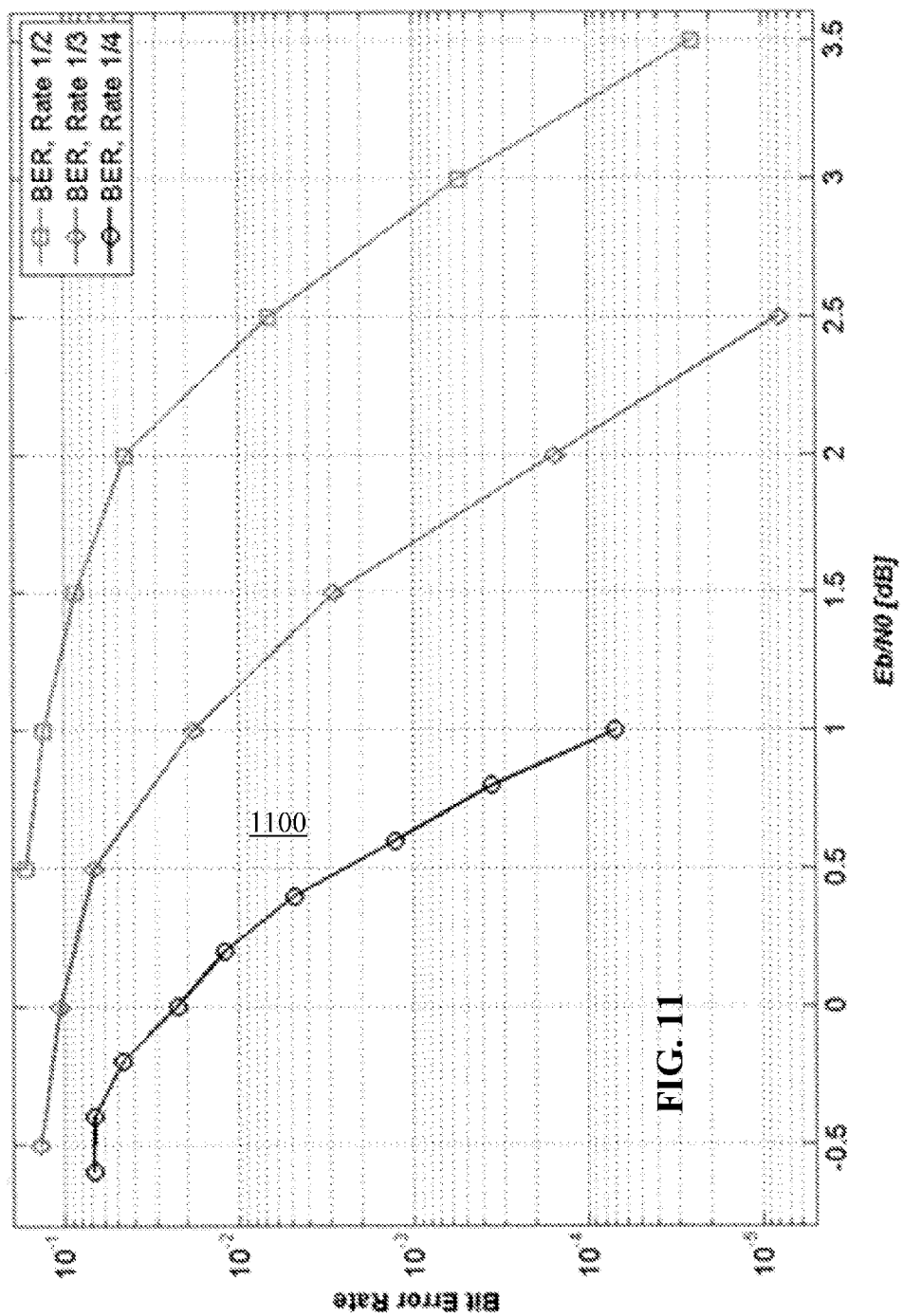
FIG. 11 shows the BER performance of the MR-ALDPC-CC for various coding-rates.

FIG. 11 shows BER performance 1100 of the MR-ALDPC-CC for various coding-rates. The proposed ensemble can achieve coding gains at low-rates up to 3.5 dB at BER=1e−5, which is quite high in comparison to what is achieved by the solutions proposed so far.

The MR-ALDPC-CC techniques presented herein are such that inherently the implementation in encoding and decoding complexity is low. Examples and analysis of such low complexity implementations are discussed below.

Referring back to FIG. 5, we see that channel encoder 500 comprises mainly LDPC-CC encoder 510 of the mother syndrome former matrix $H^T$ of rate b/c, with memory order $m_s$ and period T, as well as two sets of programmable accumulators 550, 560. LDPC-CC encoder 510 for $H^T$ is based on shift registers, and is based directly on the connections defined in the transposed parity-check matrix.

LDPC-CC encoder 510 for $H^T$ comprises c parallel shift registers, each having $m_s+1$ delay elements. The shift registers are bit-valued registers. At each encoding time instant t, b information bits enter the encoder in parallel, denoted as $u_i(t)$, i=1, ..., b and 2c−b parity bits are generated by the encoder in a parallel fashion, denoted as $q_j(t)$, j=1, ..., 2c−b. The MR-ALDPC-CC encoder produces a systematic codeword having a maximum length equal to 2c in the case that all accumulators are enabled. The encoding procedure is defined by equations (6)-(9). The MR-ALDPC-CC codes are systematic codes in the case that the mother $H^T$ matrix is a systematic one, as well. Therefore, information bits appear as are, at the generated codeword.

i) Systematic information bits: (Equation 6)
$$u_i(t) = u_i(t), i = 1, \ldots b, \forall\, t$$

ii) Parity bits: (Equation 7)
$$q_j(t) = \sum_{k=1}^{b} u_k(t) h_0^{(j-b,k)}(t) + \sum_{l=1}^{m_s} \sum_{k=1}^{c-b} q_k(t-l) h_l^{(j-b,k)}(t),$$
$$j = 1, \ldots, c-b, \forall\, t$$

$$q_j(t) = u_i(t) \otimes q_j(t-1), i = 1, \ldots b,$$ (Equation 8)
$$j = c-b+1, \ldots, c, \forall\, t$$

$$q_j(t) = q_n(t) \otimes q_j(t-1),$$ (Equation 9)
$$n = 1, \ldots c-b, j = c+1, \ldots, 2c-b, \forall\, t$$

The MR-ALDPC-CCs encoder features low-complexity. Its complexity depends on the mother syndrome former matrix $H^T$ properties such as period T, memory order $m_s$, rate $r = b/c$ and, average check degree $\overline{d_c}$ of the mother $H^T$ code. The complexity order is $O_{(v_s)}$, where $v_s = c \cdot (m_s+1)$ is the constraint length of the mother $H^T$ matrix. Table I summarizes the complexity of the MR-ALDPC-CCs encoder when compared with the complexity mother LDPC-CC encoder for mother syndrome former matrix $H^T$.

TABLE I

Complexity Analysis of MR-ALDPC-CC encoder and mother LDPC-CC encoder

| ROM | Latching elements (D-FF) | Additions (XOR Gates) | AND gates |
|---|---|---|---|
| MR-ALDPC-CC Encoder | | | |
| $\overline{d_c} \times T$ | $c \times (m_s + 1) + c$ | $\overline{d_c} \times T - (c-b) \times T + c$ | $\overline{d_c} \times T - (c-b) \times T$ |
| LDPC-CC Encoder for mother syndrome former matrix $H^T$ | | | |
| $\overline{d_c} \times T$ | $c \times (m_s + 1)$ | $\overline{d_c} \times T - (c-b) \times T$ | $\overline{d_c} \times T - (c-b) \times T$ |

The LDPC-CC encoder having syndrome former matrix $H^T$) includes $c \times (m_s+1)$ latching elements for storing the previous code-word bits. It needs a maximum number of $\Sigma_i dc_i - (c-b) \cdot T \equiv \overline{dc} \cdot T - (c-b) \cdot T$ additions and the same number of AND gates. The notation $\overline{dc}$ notes the average check-node degree. The additions are modulo-2 and can therefore be implemented by c-b XOR gates. The number of inputs of each XOR gate depends on the degree of the specific check node. A number of AND gates are used to control which connections are coupled to the XOR gates. When the same connections are shared between nodes in different time indexes, the AND gates are reduced.

Consequently, the complexity of the MR-ALDPC-CC encoder is of similar order with the complexity of the encoder based on the $H^T$ matrix as the MR-ALDPC-CC encoder requires just an additional number of c D-FFs and c XOR gates.

The encoding procedure disclosed just above is preferred over an encoding procedure that is performed on the MR-ALDPC-CC syndrome former $eH^T$ of rate b/2c. Direct encoding based on the MR-ALDPC-CC syndrome former $eH^T$ of rate b/2c may be proven cumbersome as a non-systematic code is produced. This is due to the fact that the $eH_0^T$ does not have full rank equal to (2c−b)) since each one of the $eH_i^T$ submatrices has larger dimensions than the corresponding $H_i^T$ as it is deduced by equations (4) and (5). Moreover, in this case different $eH^T$ syndrome former matrices need to be derived depending on which accumulators are enabled or disabled.

The iterative decoding procedure of MR-ALDPC-CCs encoded transmitted bit stream is based on the $eH^T$ matrix. Although the Tanner graph corresponding to $eH^T$ has an infinite number of nodes, the distance between two variable nodes that are connected to the same check node is limited by the syndrome former memory of the basic $H^T$ code. This allows continuous and pipelined decoding that operates on a finite window sliding along the received sequence. The decoding of two variable nodes that are at least $(m_s+1)$ time units apart can be performed independently, since the relevant bits cannot participate in the same parity-check equation. This allows the parallelization of I iterations by employing I independent identical processors working on different regions of the Tanner graph simultaneously.

Consequently, the MR-ALDPC-CC decoder can be constructed as the concatenation of multiple, identical units, called processors that execute data within the time-frame of $(m_s+1)$ time units. Each processor implements the message-passing algorithm and consists of storage elements, check nodes and variable nodes. When the first 2c received symbols of the transmitted sequence enter the pipeline decoder, it takes I·(ms+1) time units for this 2c-tuple to reach the output of the decoder where the decision on these symbols is made. Once this initial decoding delay of the pipeline decoder has elapsed, the decoder produces a continuous output stream, i.e., at each time unit, 2c newly received values enter the decoder and 2c decoded bits leave it. The I processors perform the I decoding iterations simultaneously. At each time unit, the i-th processor begins by activating the first column of (2c−b) check nodes in its operating region and then proceeds to activate the last column of 2c variable nodes that are about to leave the operating region. A check node activation is the step where the check node collects all the incoming messages from its neighboring variable nodes, calculates the outgoing messages, and sends the new messages to each neighboring variable node. Correspondingly, during a variable node activation, all the incoming messages to a variable node from the neighboring check nodes are collected and the new outgoing messages are calculated. Then the new messages are sent to each neighboring check node. The variable and check node updates may be based on the update rules of the employed message-passing algorithm. Any conventional message passing technique is suitable for this purpose. Some such techniques are described below in connection with the discussion of example rules 1 to 7 shown in FIGS. 12A to 12C. The aim is for the pipeline decoder to output a continuous stream of decoded data once an initial decoding delay has elapsed.

Those of skill will appreciate that various decoding techniques already proposed can also be employed for decoding MR-ALDPC-CCs.

It is noted that the decoding complexity of the MR-ALDPC-CC codes of a certain low-coding rate (<1/2) is lower than the corresponding one of LDPC-CCs.

A preferred decoding technique is disclosed herein to further reduce the complexity of the decoding of MR-ALDPC-CC codes beyond the methods described above.

Figure 13:
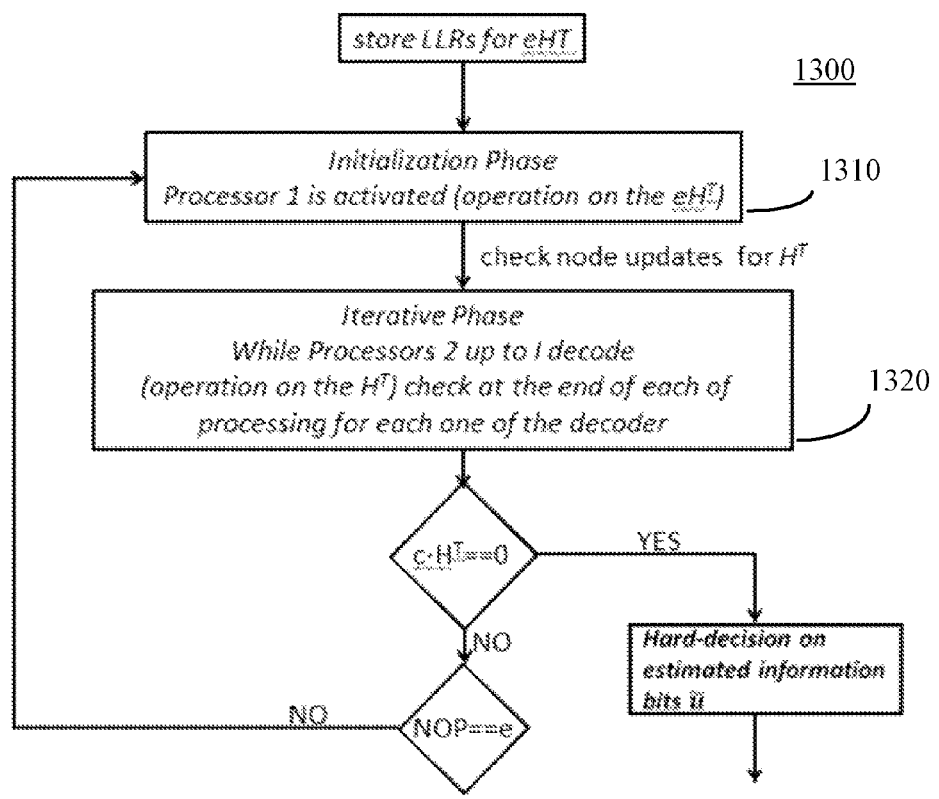
FIG. 13 shows an operational flow diagram for performing decoding according to an exemplary embodiment.

FIG. 13 shows an operational flow diagram 1300 for performing decoding according to an exemplary embodiment. Here, decoding scheduling is divided in two phases: (i) the initialization phase and (ii) the iterative (or iterative decoding) phase.

For clarity reasons, the proposed decoding process will be discussed based on a 1/4 MR-ALDPC-CC similar to that shown in FIG. 5, as well as with reference to the hardware architecture shown in FIG. 16.

Initialization Phase:

The initialization phase 1310 takes place during the activation of processor 1, which operates on the extended syndrome former $eH^T$. During this decoding step, processor 1 activates the variables $(q_2, q_3)$ and check nodes $(c_1, c_2)$ that correspond to the accumulators above and below the Tanner Graph of the mother $H^T$, according to the following update rules.

i) variable node update on accumulators:

$$Vq_2(t)=Lq_2(t), Vq_3(t)=Lq_3(t), \forall t \qquad \text{(Equation 10)}$$

where $Lq_2(t)$ and $Lq_3(t)$ are the corresponding LLR values i) check node update on accumulators based on conventional message passing formulae.

Seven such exemplary message passing techniques are detailed for clarity in FIGS. 12A to 12C.

Iterative Decoding Phase:

During this iterative decoding phase 1320, each one of the rest of the processors (I>1) operates on the Tanner Graph that corresponds to the mother syndrome former $H^T$. Therefore, processor 2 up to processor I iterate over the $H^T$ matrix performing variable and check nodes updates according to the applied message-passing rules.

The stopping criterion is applied to the $H^T$ by checking the condition $c \cdot H^T = 0$ (where c is the codeword that corresponds to $H^T$). Additionally, an extra criterion could be also performed in case that the iterative decoding procedure does not converge within a desired number of iterations. A certain threshold (e) value is selected and if the number of operating processors (NOP) reaches this threshold the iterative decoding procedure enters to the initialization phase and repeats the execution.

The MR-ALDPC-CC decoder operates principally on the $H^T$ and thus requires less storage elements and calculation units than the decoder which operates on the $eH^T$.

Figure 14:
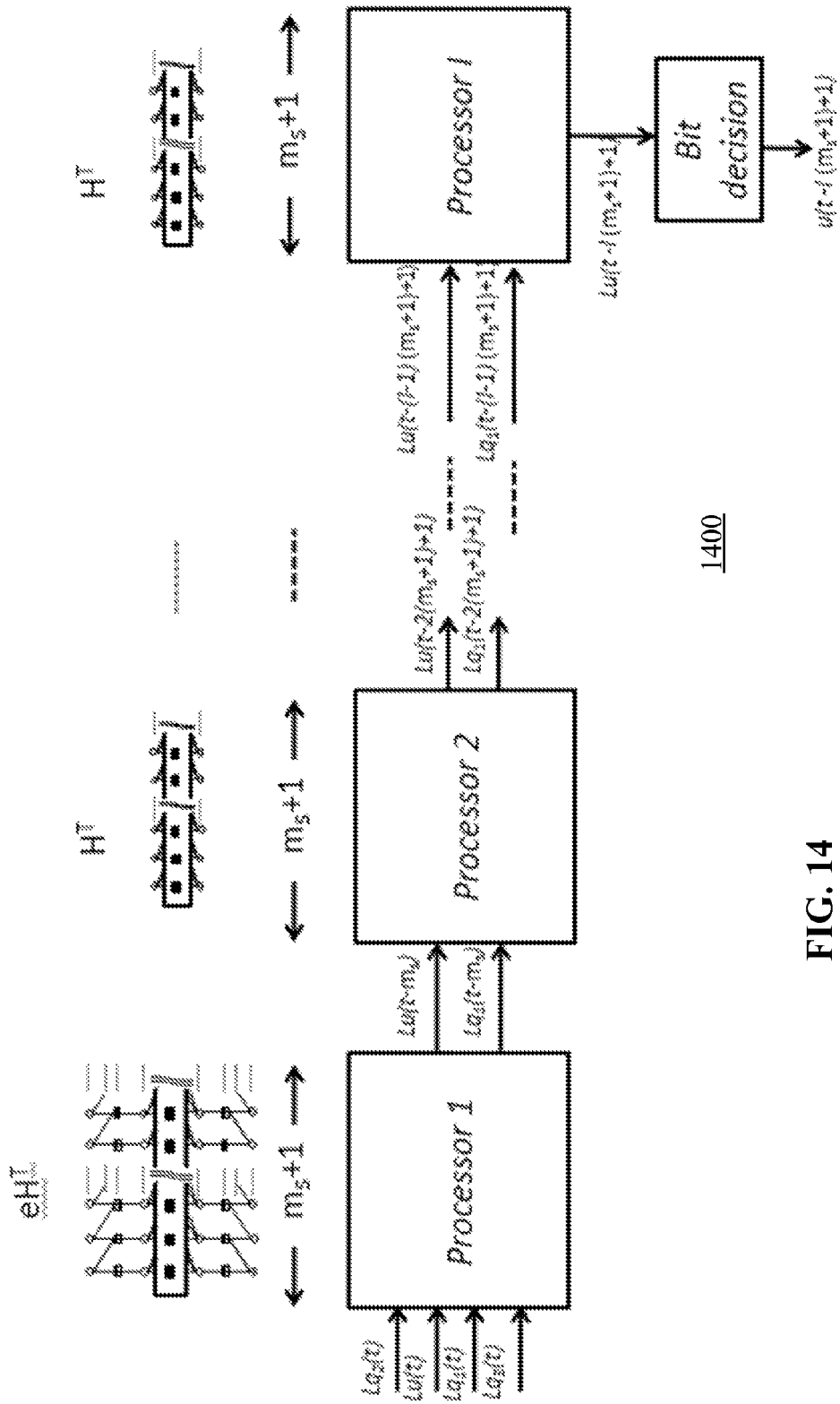
FIG. 14 shows an exemplary embodiment of an MR-ALDPC-CC decoder architecture.

FIG. 14 shows an exemplary embodiment of such an MR-ALDPC-CC decoder 1400.

Figure 15:
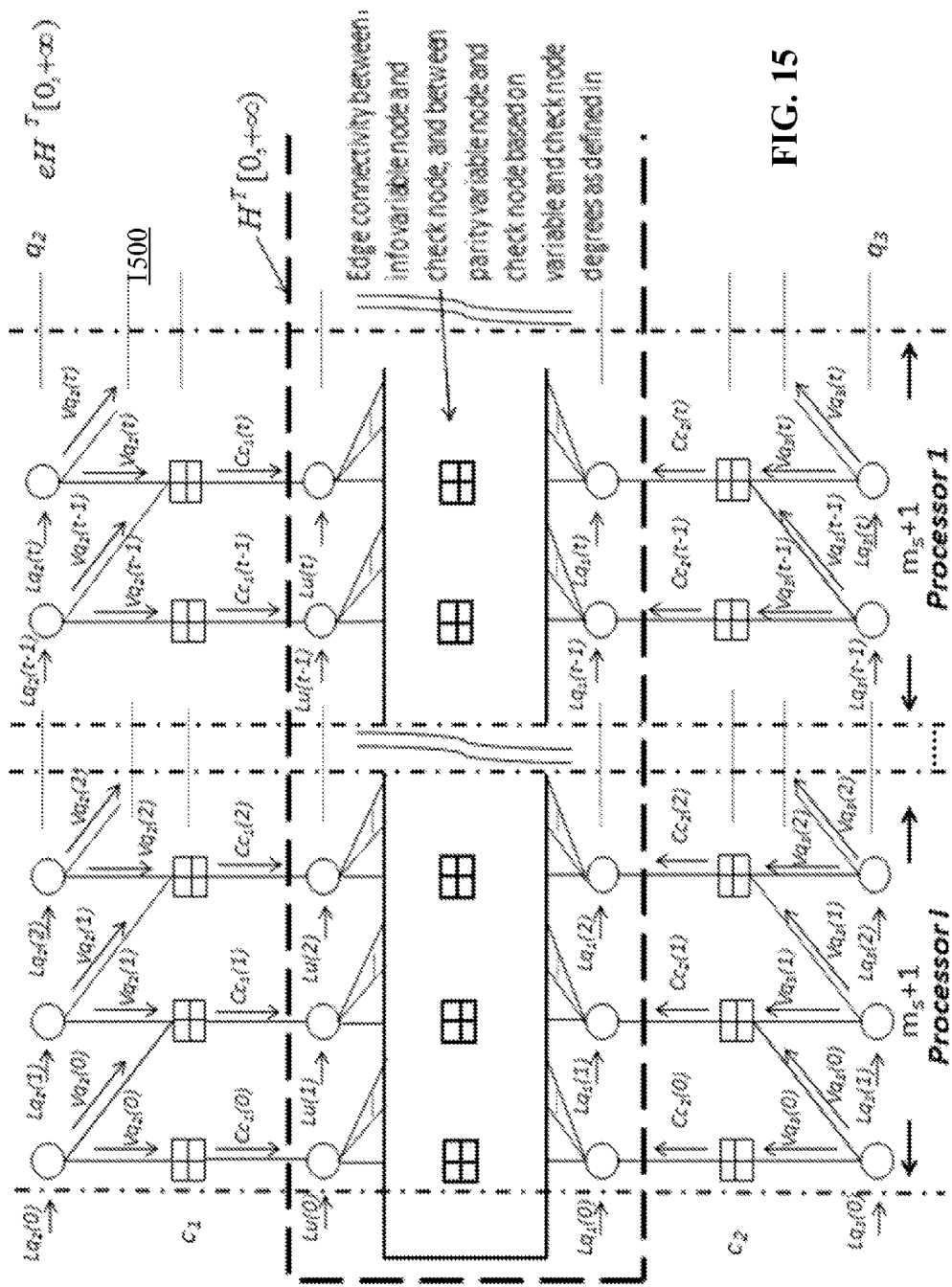
FIG. 15 shows message flow within the Tanner Graph in accordance with an exemplary MR-ALDPC-CC decoding algorithm.

FIG. 15 shows message flow 1500 within the Tanner Graph in accordance with an exemplary MR-ALDPC-CC decoding algorithm. Each one of the processors executes data within the time-frame of $(m_s+1)$ time units.

The MR-ALDPC-CC decoder complexity based on mother syndrome former matrix $H^T$ with a rate b/c and for the case that all accumulators are enabled and the min-sum update rule is employed, is discussed below. It is noted that $\overline{dv}$ is the average variable node degree while $\overline{d_c}$ is the average check degree of the extended syndrome-former matrix $eH^T$ of the MR-ALDPC-CC.

A number of $2c \times I \times (m_s+1)$ latching elements are needed for storing LLRs. A number of $$\sum_{i=1}^{c} \max\_\deg(v_{i,j}) \times I \times (m_s + 1)$$

latching elements are needed for storing messages, where $\max\_\deg(v_{i,j})$ is the maximum degree between variable node $v_i$ to check node $c_j$ for each phase. The number of latching elements can be approximated by $(2c+2c \times \overline{dv}) \times I \times (m_s+1)$.

Figure 16:
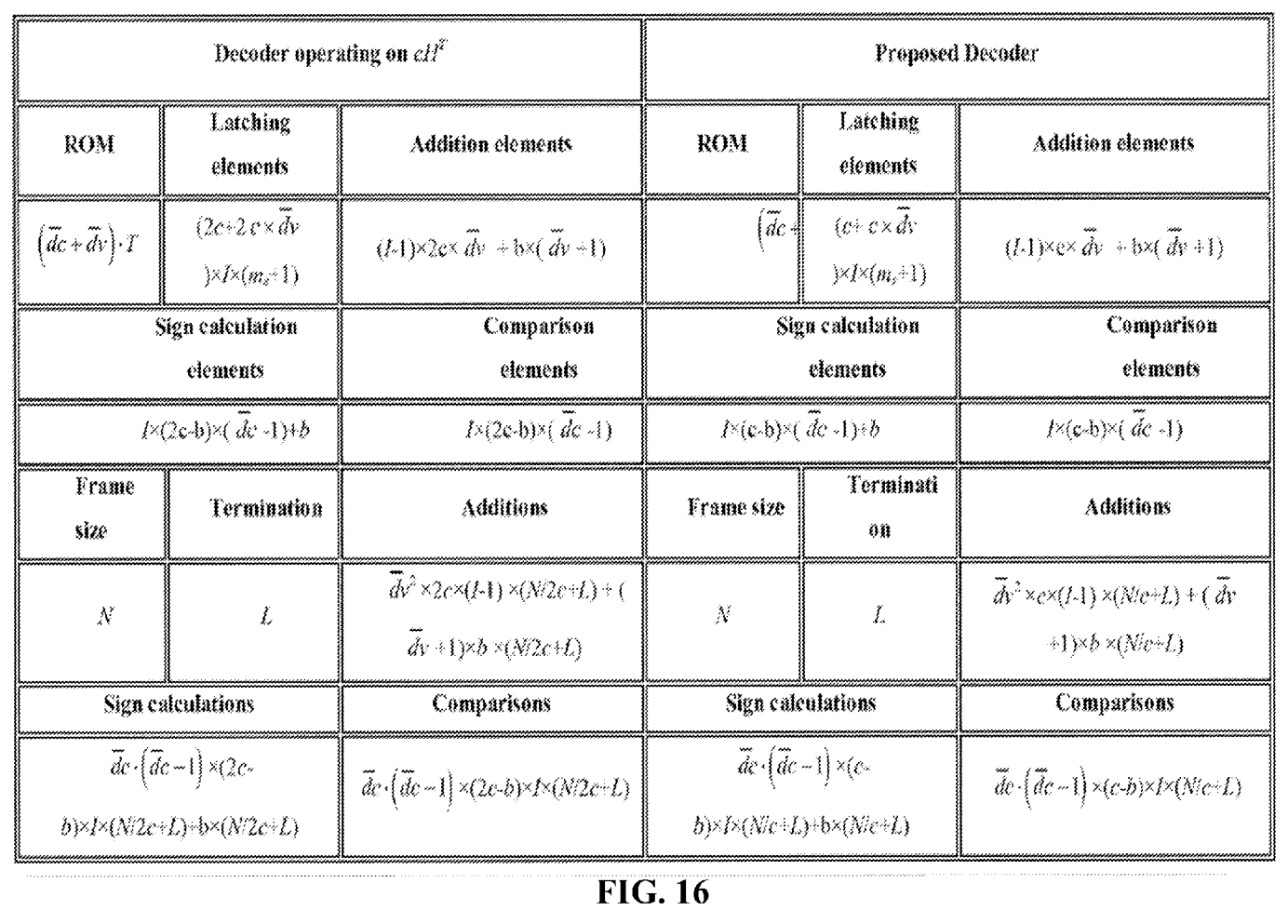

The memory and hardware resources requirements for the decoder operating on $eH^T$ and the proposed MR-ALDPC-CC decoding algorithm that operates based on $H^T$ with the exemption of the first processor are summarized in Table II shown in FIG. 16.

Figure 17:
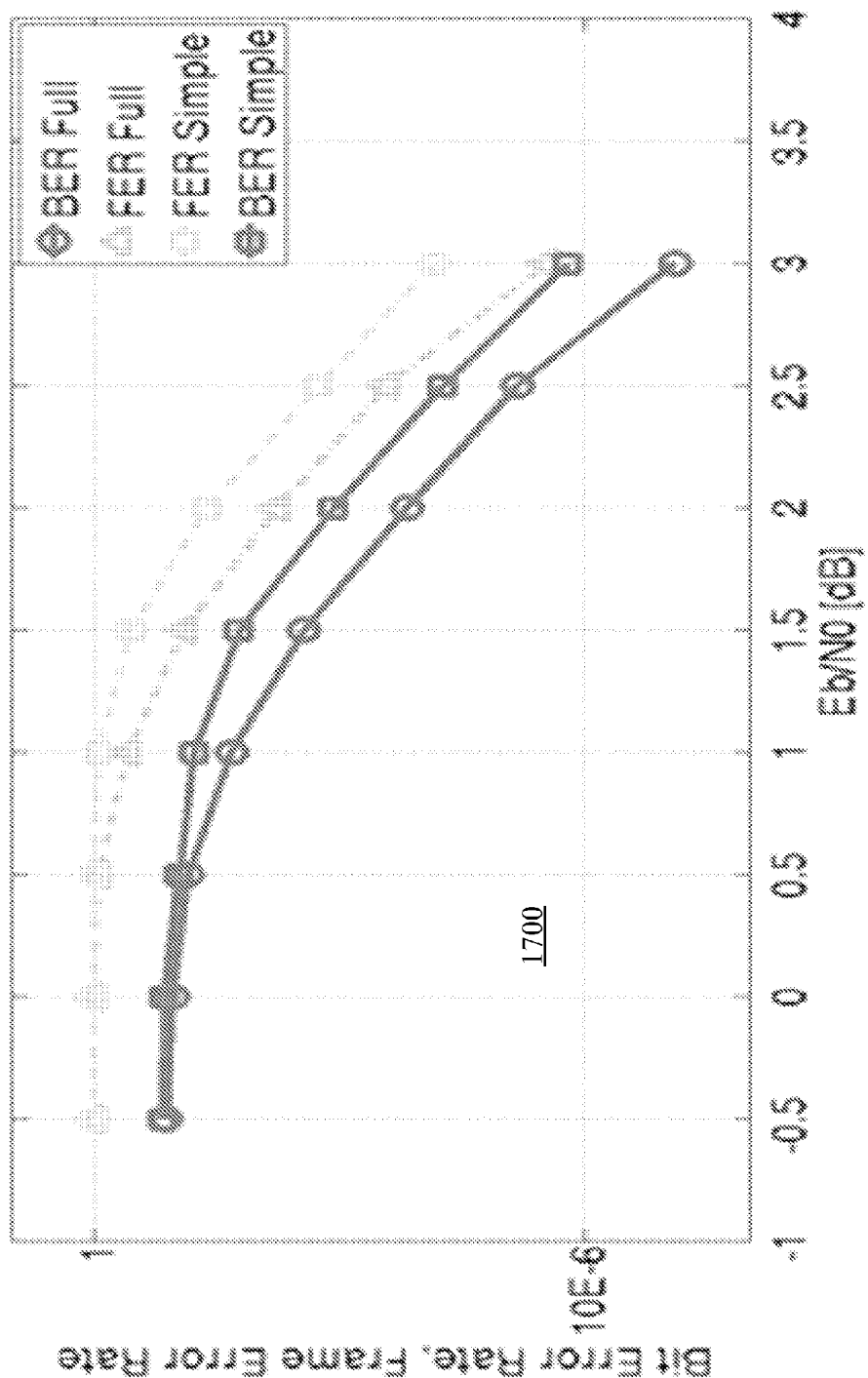
FIG. 17 illustrates error-correcting performance for an exemplary decoding process with reduced-complexity and employing a decoder operating based on $eH^T$.

FIG. 17 illustrates error-correcting performance 1700 based on a proposed decoding method of reduced-complexity and a decoder operating based on $eH^T$.

The performance is shown for a MR-ALDPC-CC code of rate equal to 1/3 that uses a regular $H^T$ mother code with memory order $m_s=85$, period T=3, $d_v=8$, $d_c=4$, b=1, c=2. The information bit sequence equals to 424 bits. Thirty processors are used for decoding and the termination length equals to L=86 bits. The coding-gain loss is about 0.4 dB at BER=1e−6 for the proposed decoding schedule in contrast to the decoder operating on the $eH^T$. The proposed decoding method reduces complexity while it does not degrade the BER performance of the MR-ALDPC-CC. Table III summarizes the complexity comparison between a decoding method based on the $eH^T$ (i.e., performed directly on the $eH^T$) and the proposed decoding method.

TABLE III

Complexity Analysis of MR-ALDPC-CC decoder based on $eH^T$ and MR-ALDPC-CC decoder operating based on the reduced complexity MR-LDPC-CC decoder.

| Decoder operating on $eH^T$ | | | Proposed Reduced-Complexity Decoder | | |
|---|---|---|---|---|---|
| ROM | Latching elements | Addition elements | ROM | Latching elements | Addition elements |
| 36 | 69660 | 705 | 36 | 46440 | 473 |
| Sign calculation elements | | Comparison elements | Sign calculation elements | | Comparison elements |
| 181 | | 180 | 91 | | 90 |
| Frame size | Termination | Additions | Frame size | Termination | Additions |
| 1272 | 86 | 2844270 | 1272 | 86 | 2686562 |
| Sign calculations | | Comparisons | Sign calculations | | Comparisons |
| 367710 | | 367200 | 260642 | | 259920 |

In a yet further alternate embodiment, the accumulators are optimized to enhance error-correcting capability of the MR-LDPC-CC. One way to do this is by introducing a reordering device of memory R at the input of the accumulators.

Figure 18:
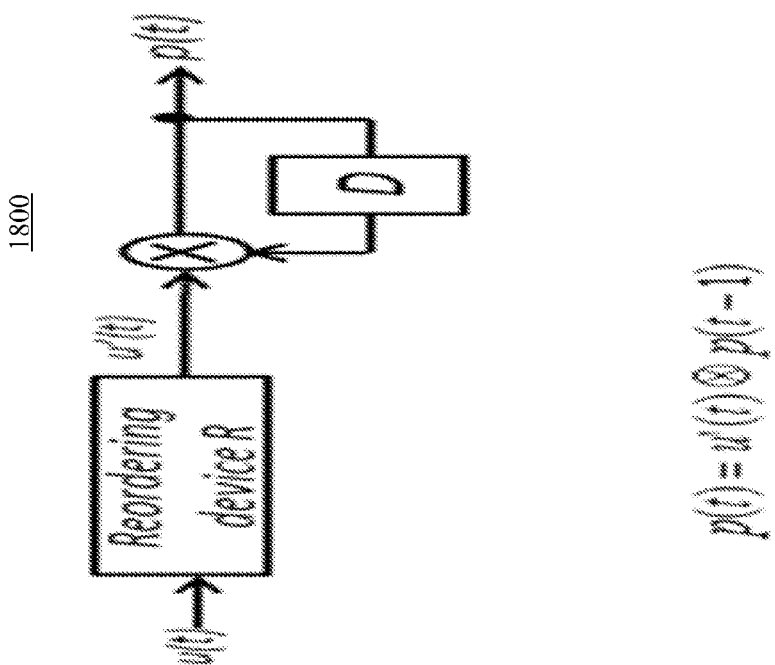
FIG. 18 illustrates the introduction of the reordering device in the accumulator branch.

FIG. 18 illustrates an alternate configuration 1800 involving the introduction of the reordering device in the accumulator branch.

Figure 19:
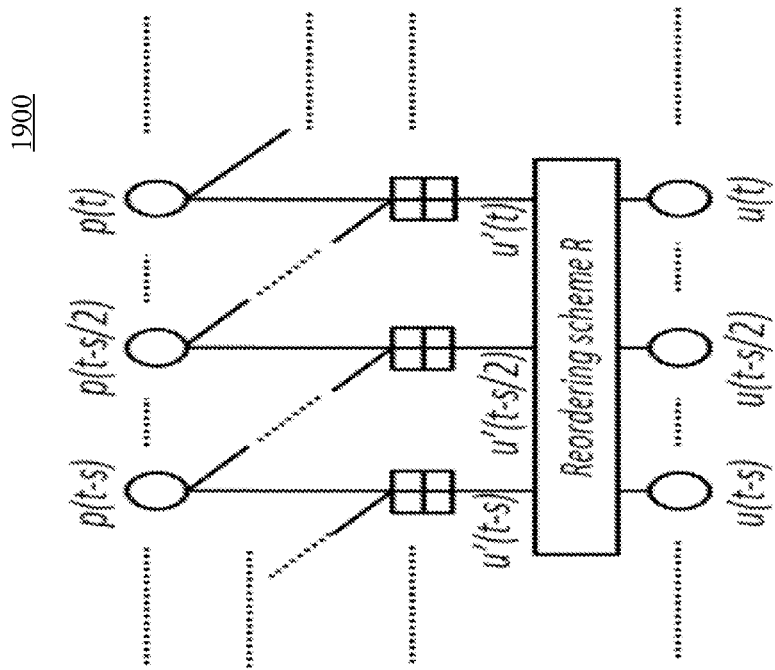
FIG. 19 shows the corresponding Tanner Graph.

FIG. 19 shows the corresponding Tanner graph 1900 for the configuration in FIG. 18. The usage of a reordering device of memory R and of specific reordering pattern serves to improve code robustness in the face of channel errors.

Figure 20:
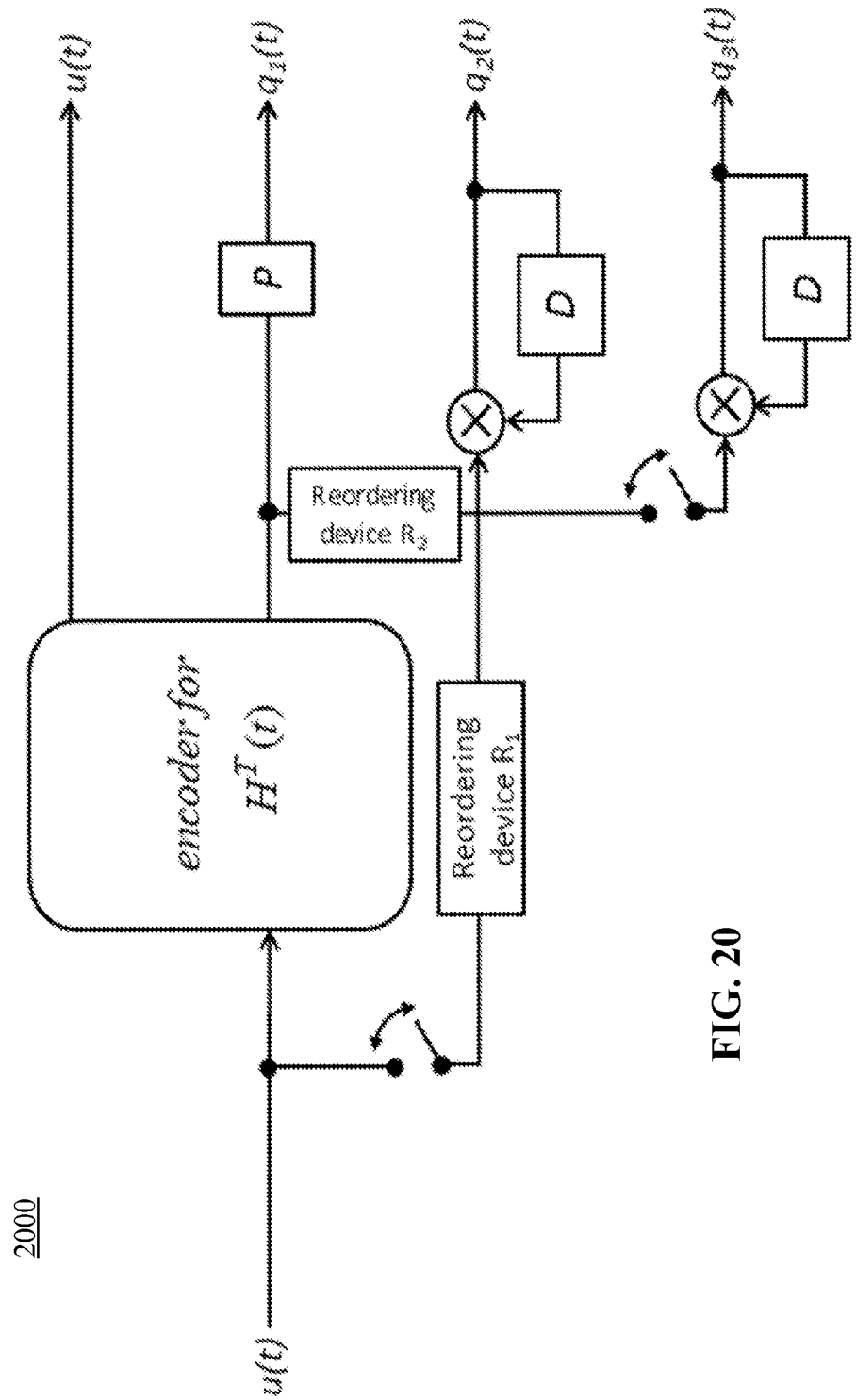
FIG. 20 shows a rate 1/4 MR-ALDPC-CC code with two reordering devices R1 and R2 at the accumulator branches of the parities $q_2(t)$ and $q_3(t)$, respectively.

FIG. 20 shows an arrangement 2000 of a rate 1/4 MR-ALDPC-CC code with two reordering devices R1 and R2 at the accumulator branches of the parities $q_2(t)$ and $q_3(t)$, respectively.

Figure 21:
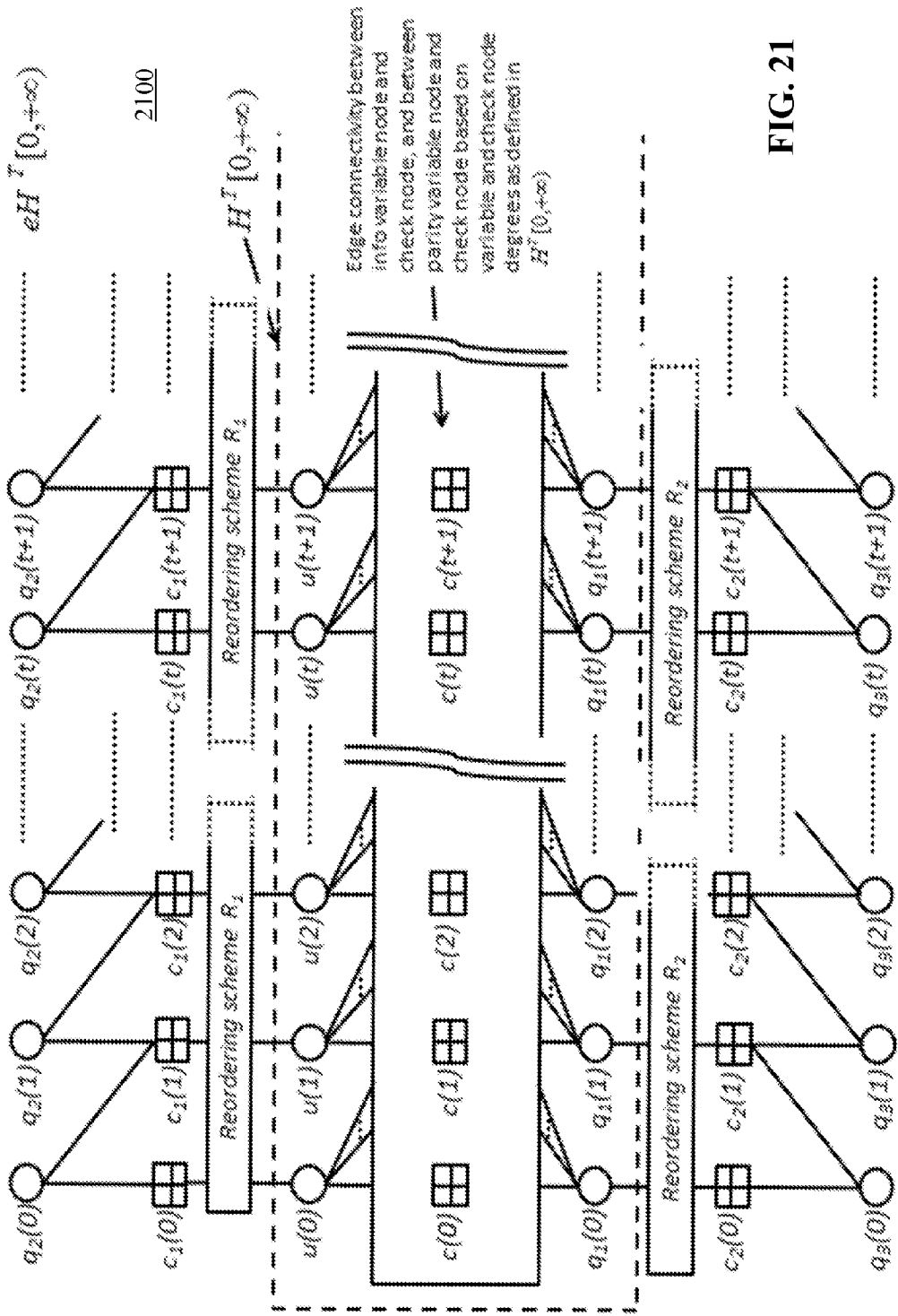
FIG. 21 shows the corresponding Tanner graph of the coding technique of FIG. 20.

FIG. 21 shows the corresponding Tanner graph 2100 of the coding technique of FIG. 20.

Such decoding procedure can be performed either by a reduced-complexity decoder or by the full-decoder that operates on the $eH^T$. The inclusion of the reordering device increases the complexity of the calculations that necessitate the usage of a buffer (memory block) with size of R bits at the encoder and of size R LLR values at the decoder. The performance is increased by increasing the size of the reordering device and selecting appropriately the reordering scheme.

Those of skill would appreciate that the logic circuitry of the address assigner may also be implemented using a processor, DSP, hardwire logic, or software embedded in a processor.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A device for encoding a sequence of information bits, comprising:
   an LDPC-CC encoder to generate a first part of a codeword from a sequence of information bits;
   a set of programmable accumulators coupled to the LDPC-CC encoder to generate a second part of the codeword, where the second part of the codeword generated at the output of the set of programmable accumulators is combined with the first part of the codeword to generate the codeword, and where the code rate of the codeword is varied by the number of accumulators being enabled to connect to the encoder;

a puncturing unit coupled to the output of the encoder for shortening the length of the first part of the codeword; and a rate matching unit coupled to the output of the encoder, to the output of the puncturing unit and to the output of the set of programmable accumulator to further adjust the code rate of the codeword.

2. The device of claim 1, further comprising a plurality of sets of programmable accumulators cascaded with each other, where a first set of the plurality of sets of programmable accumulators receives the second part of a codeword and where each set of the plurality of sets of programmable accumulators generates a sequence of parity bits.

3. A method of encoding information bits at multiple rates, comprising:

generating a first part of a codeword, the first part having a first rate in accordance to an LDPC-CC encoder;

generating a second part of the codeword by enabling a set of accumulators coupled to the LDPC-CC encoder;

combining a second part of the codeword with the first part of the codeword to generate the codeword having a second rate;

shortening the length of the first part of the codeword by a puncturing unit coupled to an output of the LDPC-CC encoder; and adjusting the rate of the codeword by a rate matching unit coupled to the output of the encoder, to an output of the puncturing unit and to an output of the set of accumulator.

* * * * *